US 6,739,036 B2

(12) United States Patent
Koike et al.

(10) Patent No.: US 6,739,036 B2
(45) Date of Patent: May 25, 2004

(54) ELECTRIC-COMPONENT MOUNTING SYSTEM

(75) Inventors: Hirokazu Koike, Chiryu (JP); Toshiya Ito, Nishio (JP); Shinsuke Suhara, Kariya (JP)

(73) Assignee: Fuji Machine Mfg., Co., Ltd., Chiryu (JP)

( * ) Notice: Subject to any disclaimer, the term of this patent is extended or adjusted under 35 U.S.C. 154(b) by 92 days.

(21) Appl. No.: 09/948,583

(22) Filed: Sep. 10, 2001

(65) Prior Publication Data
US 2002/0029468 A1 Mar. 14, 2002

(30) Foreign Application Priority Data

Sep. 13, 2000 (JP) ......................... 2000-277902
Jun. 4, 2001 (JP) ......................... 2001-168155

(51) Int. Cl.$^7$ .............................. B23P 19/00; H05K 3/30
(52) U.S. Cl. .............................. 29/743; 29/740; 29/741; 29/742; 29/DIG. 44; 29/833; 29/834; 29/720; 29/721; 294/64.1; 414/737; 901/47
(58) Field of Search .................... 29/740, 741, 743, 29/759, 832, 834, DIG. 44, 739, 720, 721, 833; 294/64.1, 2; 414/737, 752.1; 901/40, 47; 359/212, 630

(56) References Cited

U.S. PATENT DOCUMENTS

| | | | |
|---|---|---|---|
| 5,628,107 A | | 5/1997 | Nushiyama et al. |
| 6,012,222 A | * | 1/2000 | Asai et al. ............ 29/832 |
| 6,260,260 B1 | * | 7/2001 | Suhara ............ 29/740 |
| 6,343,415 B1 | * | 2/2002 | Okuda et al. ............ 29/740 |
| 2002/0031279 A1 | | 3/2002 | Shimizu |
| 2002/0035783 A1 | | 3/2002 | Kawada |
| 2002/0083579 A1 | * | 7/2002 | Suhara et al. ............ 29/739 |

FOREIGN PATENT DOCUMENTS

JP 6-342998 * 12/1994

* cited by examiner

Primary Examiner—Peter Vo
Assistant Examiner—Minh Trinh
(74) Attorney, Agent, or Firm—Oliff & Berridge, PLC

(57) ABSTRACT

A mounting system for an electric component operates by transferring the electric component from a component supply device to a suction nozzle of a component-holding head on a circuit substrate. A relative position between a sucking surface of the suction nozzle and an axis of rotation of the component-holding head is obtained. A component-holding head and the component supply device are moved relative to each other on the basis of the obtained relative position, so as to minimize an error of relative positioning between the sucking surface and a predetermined sucking position of the electric component positioned at the component-supply portion. The head and the component supply device are then moved toward each other, for transferring the electronic components from the component supply device to the suction nozzle.

4 Claims, 19 Drawing Sheets

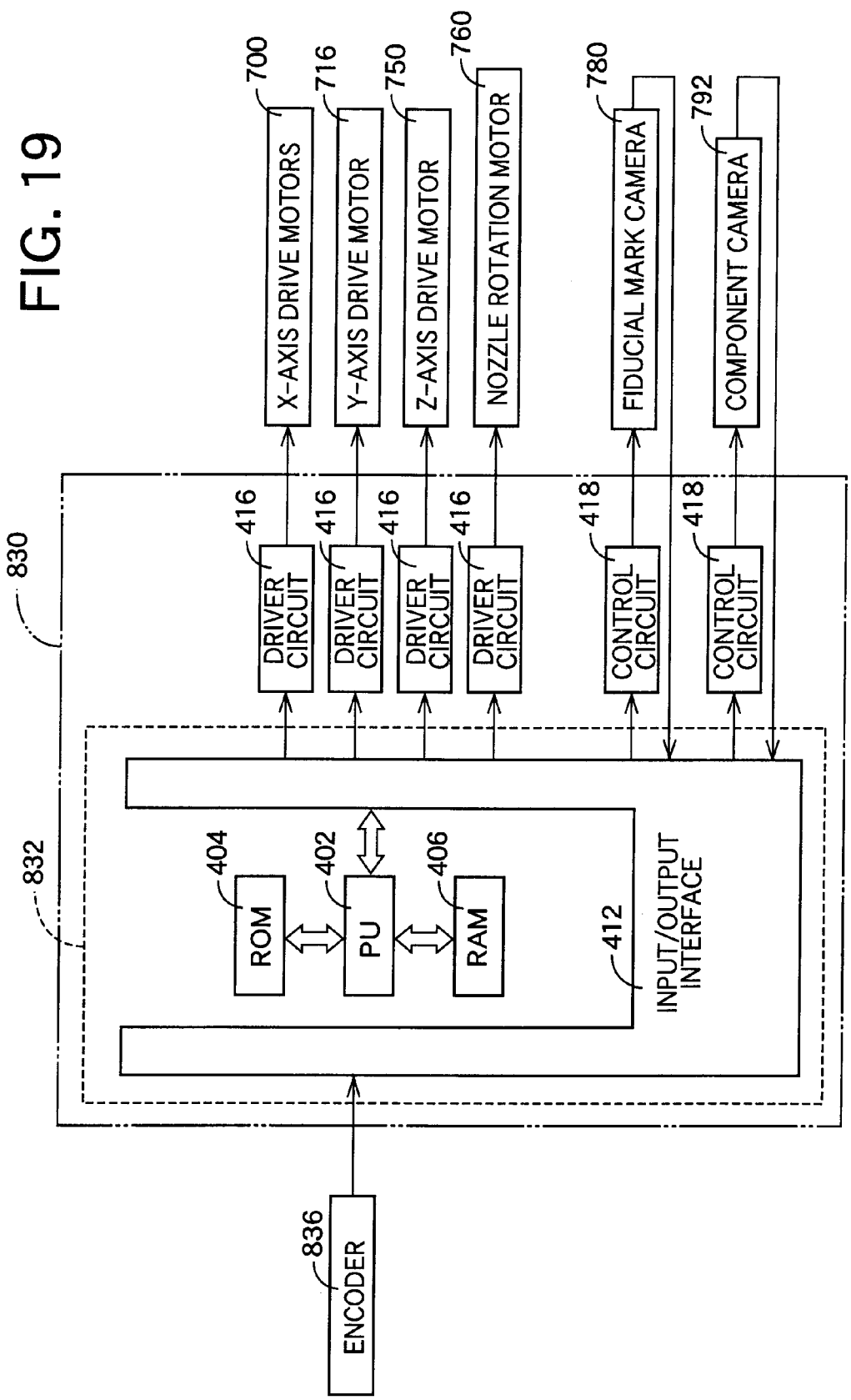

ELECTRIC-COMPONENT MOUNTING SYSTEM

BACKGROUND OF THE INVENTION

1. Field of the Invention

The present invention relates in general to a method of supplying a suction nozzle with electric components (including electronic components), and an electric-component mounting system arranged to mount the electric components on a circuit substrate such as a printed-wiring board, and more particularly to techniques for reducing a failure of the suction nozzle to hold the electric components by suction.

2. Discussion of Related Art

A suction nozzle is arranged to hold an electric component by suction under a reduced or negative pressure, and is used in an electric-component mounting system, for example. In the electric-component mounting system, the electric component is supplied from a component supply device, and is held by the suction nozzle, so that the electric component is mounted on a circuit substrate. The suction nozzle is arranged to receive the electric components from the component supply device, at a predetermined component receiving position, but may suffer from a sucking failure, that is, a failure to correctly hold the electric component by suction, such as a failure to receive the electric component.

The sucking failure takes place due to inadequate positioning of the electric component with respect to the suction nozzle upon sucking of the electric component by the suction nozzle, a positioning error of the component supply device and a positioning error of a component-holding head which holds the suction nozzle. An adequate sucking position of the electric component at which the electric component can be sucked by the suction nozzle with high stability changes with the specific shape and size of the electric component, and may deviate from the center position of the electric component. The inadequate positioning error of the electric component with respect to the suction nozzle may be caused when the component supply device and the suction nozzle are positioned relative to each other such that the electric component is always sucked at its central portion by the suction nozzle. The positioning errors of the component supply device and the component-holding head may be caused by manufacturing and assembling errors and local thermal expansion of the component supply device, the component-holding head and the related devices. In view of the above, it has been a conventional practice to determine the sucking position of the electric component depending upon the specific kind of the electric component, obtain the positioning errors of the component supply device and the component-holding head, and position the sucking surface of the suction nozzle and the component supply device relative to each other, on the basis of the determined sucking position and the obtained positioning errors, for thereby reducing the inadequate positioning of the electric component with respect to the suction nozzle.

However, the conventional practice still suffers from the sucking failure due to inadequate positioning of the electric component with respect to the sucking surface of the suction nozzle. Where the suction nozzle includes a suction pipe whose end face functions as the sucking surface, for example, a bending of the suction pipe causes a positional deviation of the sucking surface with respect to the electric component, resulting in the sucking failure, such as a failure to receive the electric component or inadequate holding of the electric component that cannot be corrected. Conventionally, bending of the suction pipe is detected to check whether the suction pipe if bent can be used for mounting the electric component, or whether the bent suction pipe should be replaced with a new one. This detection of the bending of the suction pipe is affected for the purpose of avoiding the use of the defective suction nozzle for mounting the electric component. However, the bending of the suction pipe is not conventionally taken into account when the electric component is sucked by the suction nozzle. This is one of the reasons for the sucking failure in the prior art.

SUMMARY OF THE INVENTION

The present invention was made in view of the problems encountered in the prior art described above. It is therefore an object of the present invention to reduce a failure of the suction nozzle to correctly hold the electric component by suction, in a method of transferring the electric component from the component supply device to the suction nozzle, and an electric-component mounting system arranged to mount the electric component on a substrate.

The above object may be achieved according to any one of the following modes of the present invention in the form of a method of supplying a suction nozzle with an electric component and an electric-component mounting system. Each of the following modes of the invention is numbered like the appended claims and depends from the other mode or modes, where appropriate, to indicate and clarify possible combinations of elements or technical features. It is to be understood that the present invention is not limited to the technical features or any combinations thereof which will be described for illustrative purpose only. It is to be further understood that a plurality of elements or features included in any one of the following modes of the invention are not necessarily provided all together, and that the invention may be embodied without some of the elements or features described with respect to the same mode.

(1) A method of controlling an operation in which electric components are transferred one after another from a component supply device to a suction nozzle which is held by a component-holding head rotatable about an axis of rotation thereof, such that the suction nozzle extends in an axial direction of the component-holding head, each of the electric components being held by the suction nozzle by suction on a sucking surface provided at a free end of the suction nozzle, the method comprising:

a relative-position obtaining step of obtaining a relative position between the sucking surface and the axis of rotation of the component-holding head;

a relative-movement step of effecting a relative movement between the component-holding head and the component supply device on the basis of the relative position obtained in the relative-position obtaining step, so as to minimize an error of relative positioning between the sucking surface and a predetermined sucking position of the electric component positioned at the component-supply portion; and a component supply step of moving, after the relative movement between the component-holding head and the component supply device in the relative-movement step, the component-holding head and the component supply device toward each other, for transferring one of the electronic components from the component supply device to said suction nozzle.

In the absence of a positioning error of the sucking surface with respect to the axis of the component-holding head (hereinafter referred to simply as "head axis"), there is established a predetermined relative position between the predetermined sucking position of the electric component and the head axis, so that there is established a predetermined relative position between the sucking surface and the predetermined sucking position, when the electric component (typically, an electronic component) is transferred from the component-supply portion to the suction nozzle. In the presence of a positioning error of the sucking surface with respect to the head axis, on the other hand, there exists a positioning error between the sucking surface and the predetermined sucking position of the electric component positioned at the component-supply portion. This positioning error between the sucking surface and the predetermined sucking position corresponds to the positioning error between the sucking surface and the head axis. Where the angular position of the component-holding head in which the relative position between the sucking surface and the head axis is obtained is the same as the angular position in which the electric component is transferred from the component-supply portion to the suction nozzle, the relative positioning error between the sucking surface and the predetermined sucking position of the electric component when the electric component is transferred from the component-supply portion to the sucking surface can be obtained on the basis of the obtained relative position between the sucking surface and the head axis. Accordingly, the sucking failure of the suction nozzle can be reduced, by moving the component-holding head and the component-holding device relative to each other so as to minimize the relative positioning error between the sucking surface and the predetermined sucking position.

The method according to the above mode (1) of this invention is effective particularly where the suction nozzle includes a suction pipe which has the sucking surface at its free end and which may have some degree of bending. According to the present method, the component-holding head and the component supply device are positioned relative to each other so as to minimize the error of relative positioning between the sucking surface and the component-supply portion, even in the presence of a relative positioning error between the sucking surface and the head axis, which is caused by bending of the suction pipe. When the electric component is transferred from the component-supply portion to the suction nozzle, the amount and direction of the relative positioning error which may be caused by the bending of the suction pipe are obtained, and the component-holding head and the component supply device are positioned relative to each other on the basis of the obtained relative positioning error, so as to minimize this error. The present method is effective to prevent a sucking failure of the suction nozzle even where the electric component is relatively small and the suction pipe has some degree of bending and/or positioning error.

(2) A method according to the above mode (1), wherein the relative-position obtaining step, the relative-movement step and the component supply step are affected when the component-holding head is placed in a same angular position thereof.

(3) A method according to the above mode (1), wherein the relative-position obtaining step, the relative-movement step and the component supply step are affected when said component-holding head is placed in a predetermined angular position thereof.

(4) A method according to any one of the above modes (1)–(3), wherein the relative-position obtaining step comprises:

a first image-taking step of operating an image-taking device to take a first image of the sucking surface in an axial direction of the component-holding head toward the sucking surface;

a rotating step of rotating the component-holding head about the axis of rotation by a predetermined angle;

a second image-taking step of operating the image-taking device to take a second image of the sucking surface; and an obtaining step of obtaining a position of the axis of rotation of the component-holding head on the basis of at least the first and second images of the sucking surface taken in the first and second image-taking steps, and obtaining the relative position between the sucking surface and the axis of rotation.

The first imaging angular position in which the first image of the sucking surface is taken in the first image-taking step and the second imaging angular position in which the second image of the sucking surface is taken in the second image-taking step may both be different from the predetermined angular position in which the electric component is transferred from the component-supply portion to the suction nozzle, or one of the first and second imaging angular positions may be the same as the predetermined angular position, as in a method according to the following mode (5). The position of the axis of rotation of the component-holding head may be obtained on the basis of at least one additional image of the sucking surface as well as the first and second images taken in the first and second image-taking steps.

The center points of the first and second images of the sucking surface taken at the first and second angular positions of the component-holding head lie on a circle having its center on the axis of rotation of the component-holding head. The position of the axis of rotation of the component-holding head is obtained by calculation on the basis of the center points of the first and second images of the sucking surface and the first and second imaging angular positions with respect to a predetermined angular zero position of the head, namely, angular differences of the first and second imaging angular positions with respect to the angular zero position.

Where one of the first and second imaging angular positions is the same as the predetermined angular position, the first or second image of the sucking surface is taken in the angular position of the component-holding head in which the electric component is transferred from the component-supply portion to the suction nozzle. In this case, the positioning error between the center point of the image of the sucking surface taken in the predetermined angular position of the head and the obtained position of the axis of rotation of the head does represent the positioning error between the center point of the sucking surface and the axis of rotation of the head placed in the predetermined angular position. Accordingly, the calculation to obtain the position of the axis of rotation of the head is simplified. Where the first and second imaging angular positions are both different from the predetermined angular position, the center point of the sucking surface when the component-holding head is placed in its predetermined angular position lies on the circle on which the center points of the first and second images of the sucking surface lie. Therefore, the center point of the sucking surface when the head is placed in the predetermined angular position can be calculated on the basis of the known first and second imaging angular positions and the predetermined angular position with respect to the angular zero position of the head, and the center points of the first and second images of the sucking surface. Thus, the relative position between the center point of the sucking surface in the predetermined angular position of the head and the axis of rotation of the head can be obtained. In this case, however, the required calculation is relatively complicated and time-consuming.

(5) A method according to the above mode (4), wherein one of the first and second images of the sucking surface is taken when the component-holding head is placed in a predetermined angular position thereof.

(6) A method according to any one of the above modes (1)–(5), wherein the relative-movement step comprises moving the component-holding head to a predetermined position along a circular arc, and moving the component-supply portion of the component supply device in a direction of tangency to the circular arc.

According to the above mode (6) of this invention, the positioning error between the sucking surface and the predetermined sucking position of the electric component positioned at the component-supply portion is substantially zeroed in the direction of movement of the component-supply portion, by moving the component-supply portion.

(7) A method according to any one of the above modes (1)–(6), wherein the electric component is transferred from the component-supply portion of the component supply device to the suction nozzle held by a selected one of a plurality of component-holding heads, and a relative movement between the selected component-holding head and the component supply device is affected in the relative-movement step, on the basis of a relative positioning error of the axes of rotation of the plurality of component-holding heads, as well as the relative position obtained in the relative-position obtaining step. For instance, the relative movement between the selected component-holding head and the component supply device is affected on the basis of a positioning error of the axis of rotation of the selected component-holding head with respect to the axis of ration of a reference component-holding head which is selected from the plurality of heads.

(8) A method according to any one of the above modes (1)–(7), wherein the relative movement between the component-holding head and the component supply device is affected in the relative-movement step, on the basis of a positional difference between the predetermined sucking position of the electric component and a center of the component-supply portion when the electric component is ready to be transferred from the component-supply portion to the suction nozzle, as well as the relative position obtained in the relative-position obtaining step.

(9) An electric-component mounting system for mounting electric components on a circuit substrate, comprising:
- a component supply device having a component-supply portion from which the electronic components are supplied one after another;
- a circuit-substrate support device for supporting the circuit substrate;
- a component-holding head rotatable about an axis of rotation thereof and arranged to removably hold a suction nozzle having a sucking surface such that the suction nozzle extends in an axial direction of the component-holding head;
- a head rotating device operable to rotate the component-holding head;
- a relative-movement device operable to move the component-holding head, the component supply device and the circuit-substrate support device relative to each other, in a direction intersecting the axis of rotation of the component-holding head;
- an axial-movement device operable to move the component-holding head and the component supply device in the axial direction toward and away from each other;
- an image-taking device operable to take an image of the sucking surface in the axial direction toward the sucking surface; and
- a control device operable to control the head rotating device, the relative-movement device, the axial-movement device and the image-taking device, and wherein the control device includes
- a relative-position obtaining portion operable to obtain a relative position between the sucking surface and the axis of rotation of the component-holding head;
- a relative-movement control portion operable to control the relative-movement device, for effecting a relative movement between the component-holding head and the component supply device on the basis of the relative position obtained by the relative-position obtaining portion, so as to minimize an error of relative positioning between the sucking surface and a predetermined sucking position of the electric component positioned at the component-supply portion; and
- a component-transfer control portion operable after the relative movement between the component-holding head and the component supply device by the relative-movement device, to control the axial-movement device to move the component-holding head and the component supply device toward each other, for transferring one of the electric components from the component-supply portion of the component supply device to the suction nozzle.

An electric-component mounting system may use a plurality of component-holding heads which, for example, are mounted on a rotating body rotatable about its axis, such that the component-holding heads are equiangularly spaced from each other along a circle having its center on the axis of rotation of the rotating body. The rotating body may be an indexing disk which is intermittently rotatable about its axis, or a rotary body which is rotatable in opposite directions by predetermined angles. The intermittently rotatable indexing disk is intermittently rotated by a suitable rotary drive device so that the component-holding heads are turned about the axis of rotation of the indexing disk, and are sequentially stopped at a plurality of working positions arranged along a circular path of turning movement. The component supply device is located at one of the working positions, while the circuit-substrate support device is located at another working position. The rotary body which is rotatable in the opposite directions by the predetermined angles is also rotated by a suitable rotary drive device so that the component-holding heads are turned about the axis of rotation of the rotary body, and are stopped at predetermined working positions. In either of these cases, the rotating body and the rotary drive device constitute the head rotating device indicated above.

The component-holding heads may be supported by respective support members which are arranged about a common axis of turning such that the support members can be turned about the common axis of turning, independently of each other. When the support members are turned about the common axis by a suitable turning device, the support members are sequentially stopped at one or more working positions, at a predetermined time interval. The component-holding heads are supported by the respective rotatable members such that the heads are spaced by the same distance from the common axis of turning. In this case, the support members and the turning device constitute a head moving device in the form of a head turning device operable to turn each component-holding head along a circular path.

The electronic-component mounting system may use at least one component-holding head mounted on a movable member which is linearly movable in a plane, in at least one of two mutually perpendicular directions. Where the movable member is movable by a positioning device in the two mutually perpendicular directions, each component-holding head can be moved to a desired position in the above-indicated plane. In this case, the movable member and the positioning device constitute a head moving device operable to move each component-holding head. The relative-movement device indicated above includes this head moving device.

The above-indicated rotating body and rotary drive device or the above-indicated plurality of support members and turning device may be mounted on a movable member which is movable in a plane in two mutually perpendicular directions. The axis of rotation of the rotating body or the common axis of turning of the support members may be perpendicular to the surface of the circuit substrate supported by the circuit-substrate support device, for instance, parallel to the vertical direction, or may be inclined with respect to the vertical direction. In this case, the relative-movement device indicated above includes the rotating body, the rotary drive device, the movable member and a positioning device for moving the movable member, or the support members, the turning device, the movable member and the positioning device.

The circuit-substrate support device may be stationary, or movable by a suitable positioning device to move and position the circuit substrate. In the latter case, the relative-movement device indicated above includes the positioning device to move the circuit substrate together with the circuit-substrate support device.

The component supply device may be stationary, or movable by a suitable positioning device to move the component supply device. In the latter case, the relative-movement device indicated above includes the positioning device to move the component supply device.

The component supply device, which is stationary or movable, includes a plurality of feeders, and a support block or table on which the feeders are mounted such that the component-supply portions of the feeders are arranged in s straight low. Each feeder accommodates a plurality of electric components of the same kind. Each feeder may be a tape feeder having a tape cartridge arranged to feed a carrier tape accommodating electric components, such that the electric components are fed one after another to the component-supply portion of the feeder. Alternatively, the feeder is arranged to feed a succession of electric components by means of a vibrator, a slideway, an air stream or a conveyor belt, or a combination thereof, such that the electric components are fed one after another to the component-supply portion. In either of these cases, the feeder includes a storage device accommodating the electric components, and a feeding device for feeding the electric components from the storage device to the component-supply portion.

Where the component supply device is movable, the support block or table supporting the feeders is moved by a table positioning device in a direction parallel to the direction of arrangement of the component-supply portions, so that the component-supply portion of a selected one of the feeders is located at a predetermined component supply position. The component-supply portions of the feeders may be arranged along a straight line, or any other lines such as a circle, a circular arc or a curve (other than the circular arc), or a combination thereof. The feeding device and the storage device of the movable component supply device may be mounted on a common support block or table, so that the feeding deice and the storage device are moved together when the common support block is moved. Alternatively, the feeding device and the storage device may be mounted on separate support blocks, respectively. In this case, the feeding device and the storage device may be mounted on respective movable support blocks so that the feeding device and the storage device are movable independently of each other. Alternatively, the storage device may be stationary.

The component supply device may be of tray type having a plurality of trays each having a multiplicity of component-accommodating recesses accommodating the respective electric components.

The image-taking device is arranged to take the image of the sucking surface of the suction nozzle in the axial direction of the component-holding head toward the sucking surface. The image-taking device may be a CCD camera, which may be disposed concentrically with the component-holding head such that the CCD camera is opposed to the sucking surface of the suction nozzle. Alternatively, the CCD camera and the component-holding head may be juxtaposed in parallel relationship with each other such that the CCD camera faces downwards. Where the CCD camera is not opposed to the sucking surface, as in the latter case, a waveguide device is provided to guide a light indicative of the image of the object (sucking surface) so as to be incident upon the CCD camera. In this case, the waveguide and the CCD camera constitute the image-taking device.

The image-taking device may be a surface-imaging device arranged to take a two-dimensional image of the object at one time, or a line sensor which includes a multiplicity of image-taking elements arranged in a straight line. In the line sensor, a two-dimensional image is formed by multiple lines of image which are taken successively while the line of the image-taking elements is moved relative to the object.

The electric-component mounting system constructed according to the above mode (9) of this invention provides substantially the same effects and advantages as described above with respect to the method according to the above mode (1). The feature according to the above mode (4) or (5) is applicable to the electric-component mounting system according to the above mode (9).

(10) An electric-component mounting system according to the above mode (9), wherein the relative-position obtaining portion, the relative-movement control portion and the component-transfer control portions are all operable when said component-holding head is placed in a predetermined angular position.

(11) An electric-component mounting system according to the above mode (9) or (10), wherein the relative-movement device comprises:

a head turning device operable to turn the component-holding head about a turning axis, such that the component-holding head can be sequentially stopped at a plurality of working positions which are arranged along a circular path of turning of the component-holding head; and a component-supply-device positioning device operable to move the component supply device in a direction of tangency to the circular path of turning, to bring the component-supply portion into alignment with one of the working positions.

(12) An electronic-component mounting system according to any one of the above modes (9)–(11), wherein the relative-movement control portion is operable to control the component-supply-device positioning moving device for positioning the component supply device such that the error of relative positioning between the sucking surface and the predetermined sucking position of the electric component in the above-indicated direction of tangency is substantially zeroed.

BRIEF DESCRIPTION OF THE DRAWINGS

The above and other objects, features, advantages and technical and industrial significance of the present invention will be better understood by reading the following detailed description of presently preferred embodiments of the invention, when considered in connection with the accompanying drawings, in which:

FIG. 19 is a block diagram showing a part of a control device for controlling the electronic-component mounting system of FIG. 15, which part largely relates to the present invention.

DETAILED DESCRIPTION OF THE PREFERRED EMBODIMENTS

Figure 1:
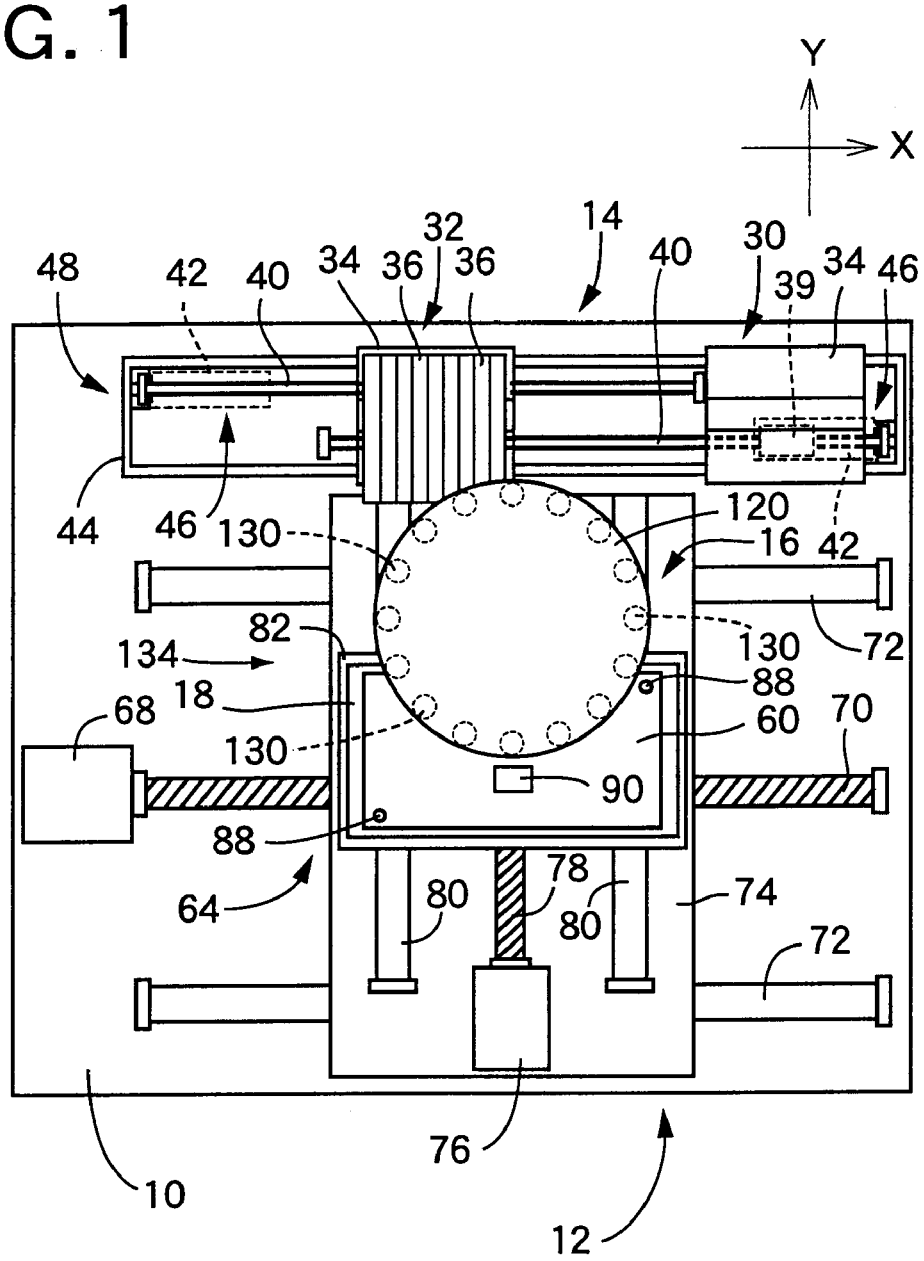
FIG. 1 is a plan view schematically showing an electronic-component mounting system constructed according to one embodiment of this invention.

Referring first to FIG. 1, reference numeral 10 denotes a machine base of an electric-component mounting system in the form of an electronic-component mounting system 12. The electronic-component mounting device 12 includes a component supply device 14, an component mounting device 16, and a circuit-substrate support device in the form of a printed-wiring board supply device (hereinafter abbreviated as "PWB support device") 18, which are mounted on the machine base. 10.

Figure 6:
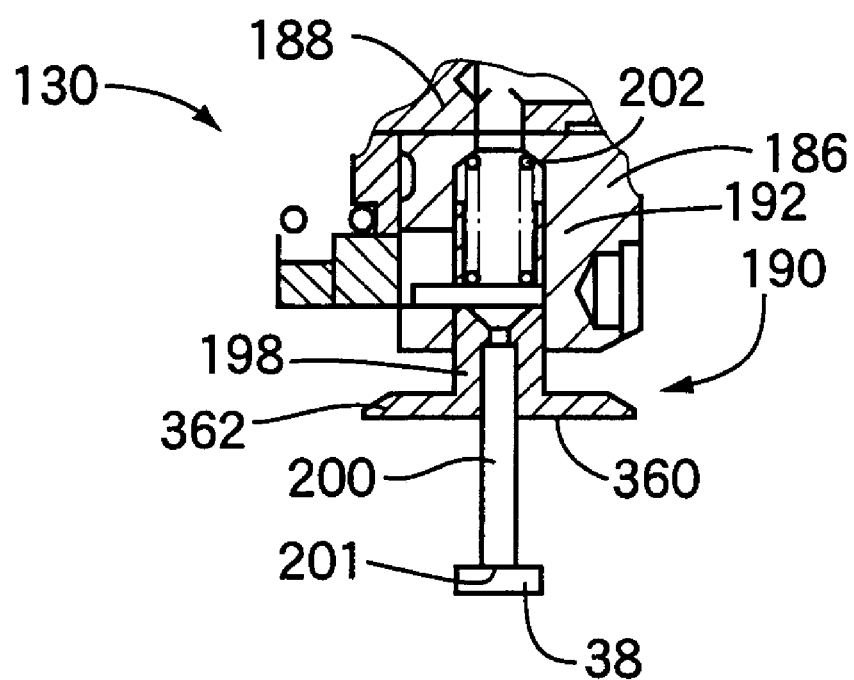
FIG. 6 is a front elevational view (partly in cross section) showing a suction nozzle as held by a mounting head of the component mounting device.

The component supply device 14 includes two component supply tables 30, 32. However, only one of these two component supply tables 30, 32 may be provided. Each of the two component supply tables 30, 32 includes a feeder support block 34, and a plurality of tape feeders 36 mounted on the feeder support block 34. Each tape feeder 36 is arranged to feed a carrier tape 22 (FIG. 2) which accommodates electric components in the form of electronic components 38 (FIG. 6).

Figure 2:
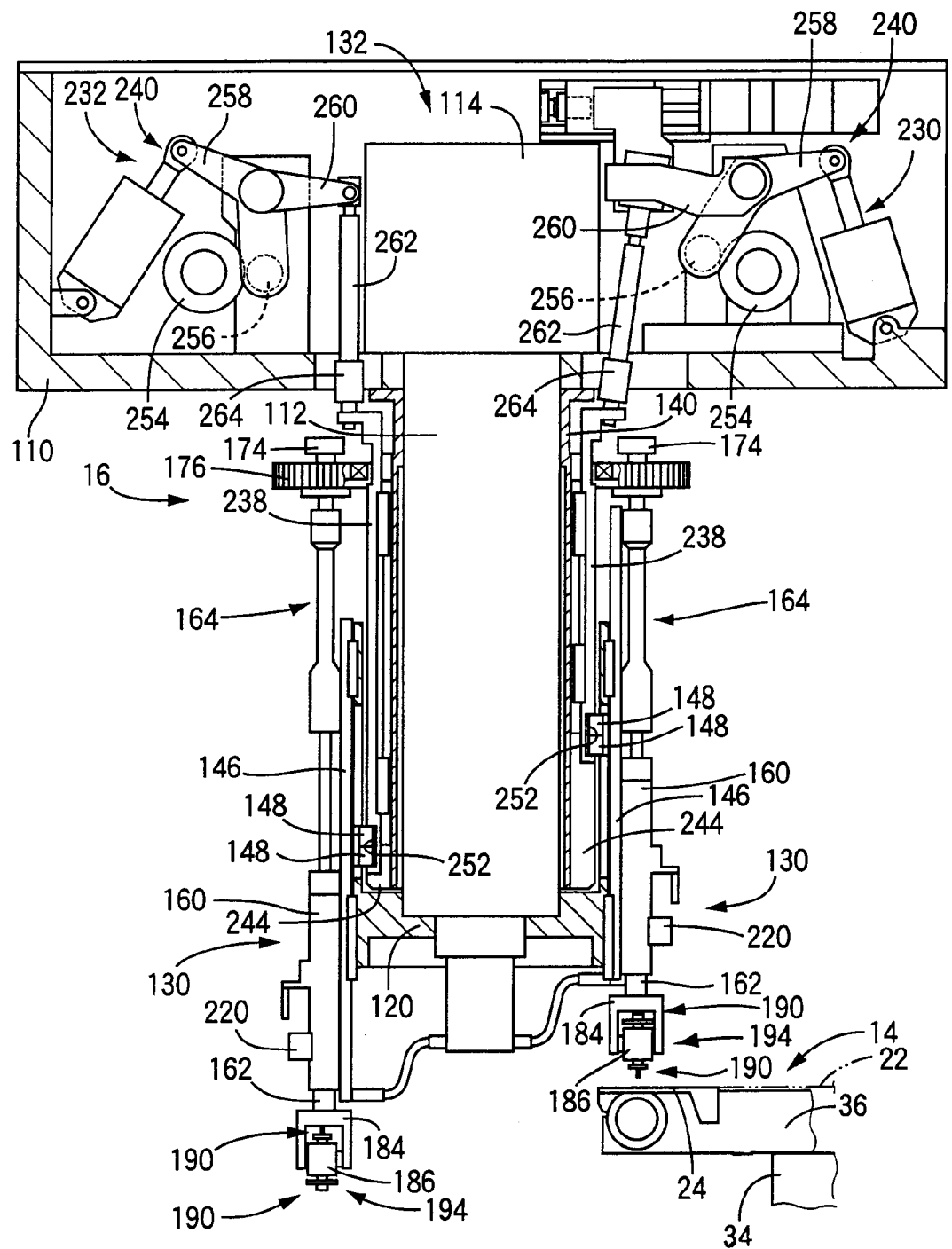
FIG. 2 is a side elevational view (partly in cross section) of a component mounting device of the electronic-component mounting system of FIG. 1.
Figure 3:
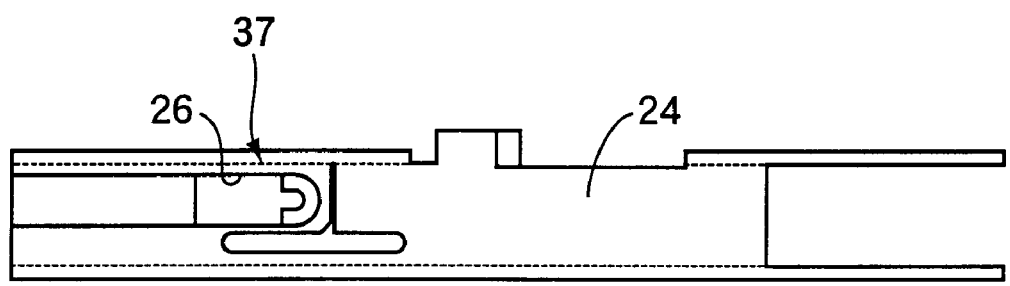
FIG. 3 is a plan view showing a covering member of a tape feeder of a component supply device of the electronic-component mounting system.

The carrier tape 22 includes a carrier substrate (not shown) which has a multiplicity of component-accommodating recesses formed at a suitable interval along the length of the tape. The electronic component 38 are accommodated in the respective component-accommodating recesses, and the opening of each recess is closed by a covering film bonded to the carrier substrate. The carrier tape 22 is fed on a body of the tape feeder 36, and a front portion of the tape feeder 36 which is located on the side of the component mounting device 36 is covered by a covering member 24, as shown in FIG. 2. The covering member 24 is attached to the body of the tape feeder 36 such that the covering member 24 is movable between its closed and open positions in which the opening 26 is closed and open, respectively. As shown in FIG. 3, the covering member 24 has an opening 26 through which each electronic component 38 is taken out from the carrier tape 22.

In operation of each tape feeder 36, the carrier tape 22 is fed by a feeding device (not shown), with a predetermined pitch while the covering film is separated from the carrier substrate, at the covering member 24. Thus, the electronic components 38 are fed one after another to a predetermined position at a component-supply portion 37 (FIG. 3) of the tape feeder 36. The component-supply portion 37 has the opening 26 through which each electronic component 38 is taken out by the component mounting device 16. The plurality of tape feeders 36 are removably mounted on the feeder support block 34 such that the component-supply portions 37 of the tape feeders 36 are arranged along a straight line, namely, along a horizontal straight line in the present embodiment. When the carrier tape 22 is advanced by the feeding device, the covering member 24 is moved with the carrier tape 22 such that the covering member 24 closes a half of the opening of the uncovered leading component-accommodating recess. When the electronic component 38 is picked up by a suction nozzle of the component mounting device 16, only the covering member 24 is retracted to fully open the component-accommodating recess in which the electronic component 38 in question is accommodated. At this time, the electronic component 38 can be picked up by the suction nozzle through the opening 26. In this condition, the component-supply portion 37 is operable to permit the electronic component 38 to be picked up through the opening 26.

Figure 4:
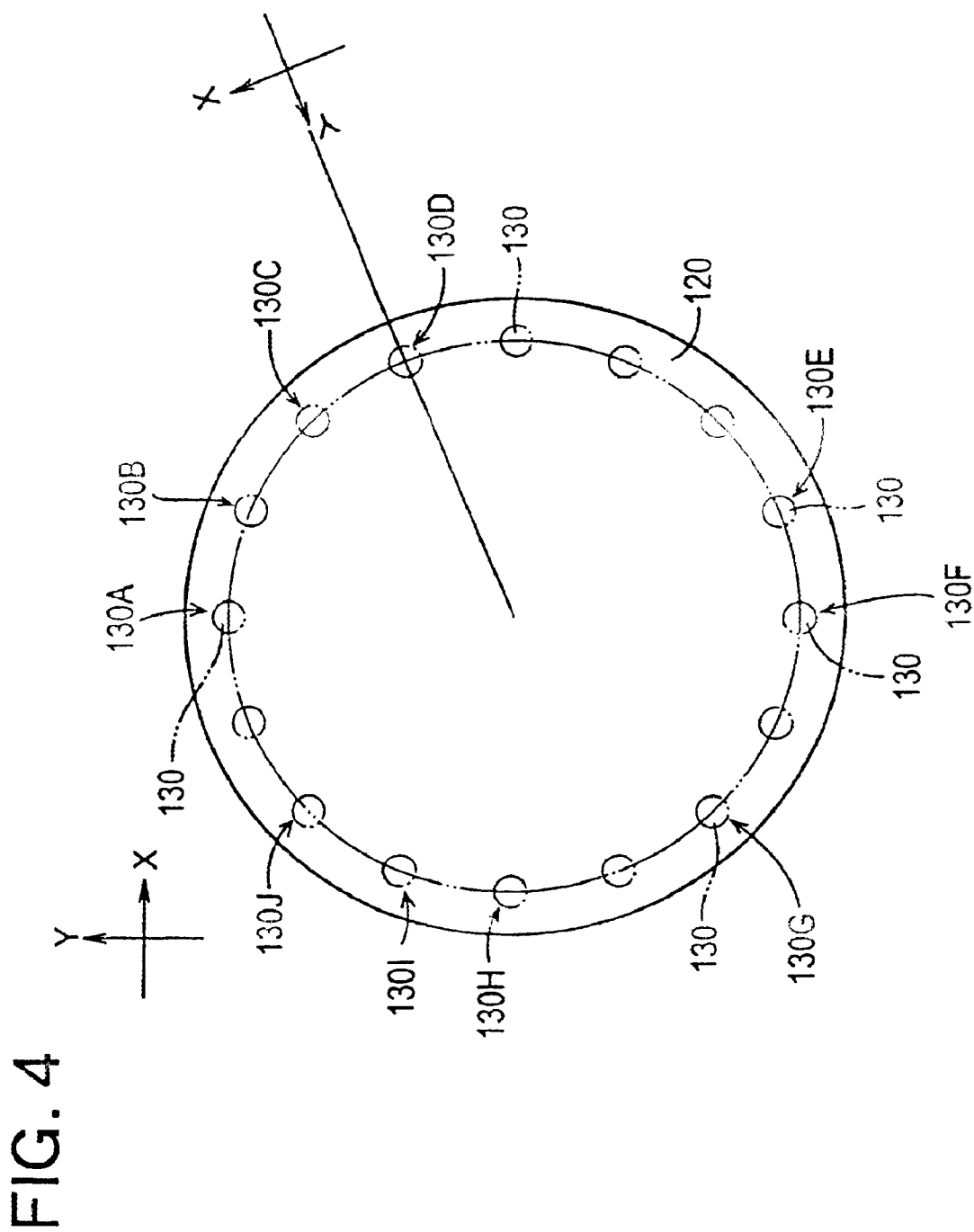
FIG. 4 is a view for explaining working stations of component-holding heads of the component mounting device of FIG. 2.

In the electronic-component mounting system 12 of the present embodiment, movement data for positioning and moving the component supply tables 30, 32, PWB support device 18 and other movable members are defined in an XY coordinate system having an X-axis direction and a Y-axis direction as indicated in FIGS. 1 and 4. That is, the X-axis and Y-axis directions of the XY coordinate system are respectively parallel to the horizontal and vertical directions as seen in the plan views of FIGS. 1 and 4 wherein the component supply device 14 is located above the PWB support device 18. The upward and rightward directions in FIG. 4 are positive X-axis and Y-axis directions, respectively. The XY coordinate system of the electronic-component mounting system 12 as seen in the downward direction, as in the plan view of FIGS. 1 and 4, is convenient to define the movement data, since operations of the component mounting device 16 to pick up the electronic components 38 from the component supply device 14 and to mount the electronic component 38 on a printed-wiring board 60 are performed on and above the component supply device 14 and the printed-wiring board 60. In the present embodiment, the component-supply portions 37 of the tape feeders 36 are arranged in the X-axis direction (in the right-and-left direction of FIG. 1).

The feeder support block 34 of each component supply table 30, 32 has a ballnut 39 fixed thereto. The ballnut 39 engages a feeds crew in the form of a ballscrew 40, which is rotated by a support block drive motor 42, so that each component supply table 30, 32 is moved in the X-axis direction while being guided by a guiding device including a guide rail 44. Thus, the component-supply portions 37 of the plurality of tape feeders 36 are selectively brought into a predetermined component supply position . The ballscrew 40 and the support block drive motor 42 constitute a major portion of a support-block positioning device or table positioning device 46 operable to move each component supply table 30, 32. In other words, the two component supply tables 30, 32 are respectively moved by two table positioning devices 46, which cooperate to provide a component-supply-device positioning device 48. The guide rail 44 is used commonly for the two component supply tables 30, 32. The electronic components 38 are supplied from the two component supply tables 30, 32 in a manner well known in the art, for instance, in a manner as disclosed in JP-B2-2-21719. In FIG. 1, the nut 39 of the component supply table 30 is shown, but the tape feeders 36 mounted on the table 30 are not shown, while the tape feeders 36 of the component supply table 32 are shown, but the nut 39 of the table 32 is not shown.

The PWB support device 18 is arranged to support or hold a circuit substrate in the form of the printed-wiring board 60, and is moved by a circuit-substrate positioning device in the form of a board positioning device 64, to a desired position in the above-indicated XY coordinate system defined by the mutually perpendicular X and Y axes. The board positioning device 64 includes an X-axis slide 74, and a Y-axis slide 82 movably mounted on the X-axis slide 74. The X-axis slide 74 is movable in the X-axis direction by an X-axis drive motor 68 through a feed screw in the form of a ballscrew 70 while being guided by guide rails 72, while the Y-axis slide 82 is movable in the Y-axis direction by a Y-axis drive motor 76 and a feed screw in the form of a ballscrew 78 while being guided by a guide rails 80. Thus, the board positioning device 64 serves as an XY positioning device.

The PWB support device 18 is mounted on the Y-axis slide 18, and is arranged to support the printed-wiring board 60 such that the board 60 maintains a horizontal attitude or posture. The top surface or component-mounting surface of the printed-wiring board 60 has a plurality of component mounting positions at which the electronic components 38 are mounted by the component mounting device 16. With the printed-wiring board 60 moved with the PWB support device 18, the component mounting positions on the board 60 are sequentially brought into alignment with a predetermined component mounting position (described below) of the component mounting device 16.

In the present embodiment, two fiducial marks 88 are provided on the top surface of the printed-wiring board 60. An image-taking device in the form of a fiducial mark camera 90 (FIG. 1) is provided take images of the fiducial marks 90 on the printed-wiring board 60 held by the PWB support device 18. The fiducial mark camera 90 is fixedly disposed by a frame (described below) of the component mounting device 16, such that the fiducial mark camera 90 faces downwards to take the images of the fiducial marks 88 in the downward direction.

The fiducial mark camera 90 includes a matrix of solid image sensors in the form of CCDs (charge-coupled devices), and a lens system, and functions as an image-taking device in the form of a surface-imaging device capable of taking a two-dimensional image of an object at one time. The DDCs are small-sized light receiving elements arranged in a matrix in a plane. Each of the light receiving elements generates an electric signal depending upon an amount of light received. The matrix of the light receiving elements defines an imaging area in which an image of the object is formed. An illuminating device (not shown) is provided near the fiducial mark camera 90, to illuminate the object and its vicinity when the image of the object is taken by the fiducial camera 90.

Referring next to FIG. 2, the component mounting device 16 will be described only briefly since the component mounting device 16 per se does not significantly relate to the present invention. The component mounting device 16 in the present embodiment is similar in construction with a component mounting device as disclosed in JP-A-6-342998, and co-pending U.S. patent application Ser. No. 09/963,431 filed May 24, 2001 issued as U.S. Pat. No. 6,507,997 B2 on Jan. 21, 2003, claiming priority of Japanese Patent Application No. 2000-164958.

In FIG. 2, reference numeral 110 denotes a frame supported by the machine base 10. The frame 110 supports a rotary shaft 112 such that the rotary shaft 112 is rotatable about a vertically extending axis. The rotary shaft 112 is rotated by a rotary drive device 114, which includes a roller gear and a roller-gear cam (not shown). The roller-gear cam is rotated in one direction at a constant speed by an intermittent rotary drive motor 116 (FIG. 8), so that a plurality of rollers of the roller gear are sequentially brought into engagement with a cam rib of the roller-gear cam, whereby the rotary shaft 112 is intermittently rotated by a predetermined angle about the vertical axis.

The rotary shaft 112 has a lower end portion extending downward from the frame 110. To this lower end portion of the rotary shaft 112, there is fixed a rotating body, more specifically, an intermittently rotating body in the form of an indexing disk 120. The indexing disk 120 carries 16 component-holding heads 130 arranged equiangularly in its circumferential direction such that each component-holding head 130 is movable in the axial direction of the indexing disk 120, that is, movable in the vertical direction, and such that each component-holding head 130 is rotatable about its axis. The component-holding heads 130 are provided to receive the electronic components 38 from the component supply device 14, and mount the electronic components 38 on the printed-wiring board 60.

When the rotary shaft 112 is continuously rotated, the indexing table 120 is intermittently rotated at an angular spacing interval of the 16 component-holding heads 130, that is, at an angular interval of 22.5°. Thus, the 16 component-holding heads 130 can be turned about a vertically extending common turning axis, namely, about the axis of rotation of the indexing disk 120, so that each component-holding head 130 can be temporarily stopped at 16 working stations or positions which are equiangularly spaced from each other along a circular path of movement. The 16 working positions include: a component receiving position 130A at which each electronic component 38 is received or picked up by suction from a selected one of the tape feeders 36 of the component supply device 14 (at which the electric component 38 is transferred from the selected tape feeder 36 to a suction nozzle 190 described below); a component attitude changing position 130C at which the attitude or angular position of the electronic component 38 is changed; a component hold-position detecting position at which the position of the electronic component 38 held by the component-holding head 130 is detected; a component hold-position rectifying position 130E at which the angular position of the electronic component 38 is adjusted; a component mounting position 130F at which the electronic component 38 is mounted on the printed-wiring board 60; an angular-head-position resetting position 130G at which the component-holding head 130 is rotated to its predetermined angular-zero position; a nozzle-holder detecting position 130I at which a currently selected one of nozzle holders 190 (described below) is detected; and a nozzle-holder selecting position 130J at which the nozzle holder 190 to be used next is selected. In the present embodiment, the rotary shaft 112 and the rotary drive device 114 constitute a major portion of an intermittently rotating device operable to intermittently rotate the indexing table 120, and the intermittently rotating device and the indexing table 120 constitute a head positioning device operable to position each component-holding head 130, in the form of a turning device 132 operable to turn each component-holding head 130 about the axis of rotation of the indexing table 120. Further, the turning device 132 cooperates with the component-supply-device positioning device 48 and the board positioning device 64 to constitute a relative-movement device 134 operable to move each component-holding head 130, the component supply device 14 and the PWB support device 184 relative to each other. The turning device 132 functions as an intermittently turning device operable to intermittently turn each component-holding head 130 about a vertical axis. The X-axis direction is parallel to a direction of tangency to the circular turning path of each component-holding head 130, at the component receiving position 130A. The component supply tables 30, 32 of the component supply device 14 are moved by the component-supply-device positioning device 48, in the above-indicated direction of tangency, such that the component-supply portions 37 of the tape feeders 36 are moved in this direction of tangency, namely, in the X-axis direction, and are stopped at a position corresponding to the component receiving position 130A.

A supporting member 146 which supports each component-holding head 130 is vertically movably supported by the indexing disk 120. A cam follower in the form of a roller 148 fixed to the supporting member 146 is held in engagement with a cam groove formed in a cylindrical cam 140 fixed to the frame 110. The cam groove is formed in the cylindrical cam 140 such that the vertical position of the cam groove gradually changes in the circumferential direction of the cylindrical cam 140, so that the roller 148 in rolling contact with the side surfaces of the cam groove is vertically moved to lift and lower the supporting member 146 and the component-holding head 130 as the component-holding head 130 is turned with the indexing disk 120 about the axis of the rotary shaft 112. In the present embodiment, the cam groove is formed so that each component-holding head 130 is placed at its upper stroke end when the head 130 is stopped at its component receiving position 130A, and is placed at its lower stroke end when the head 130 is stopped at its component mounting position 130F, and so that the head 130 is moved horizontally when the head 130 is turned near the component receiving and mounting positions 130A and 130F along the circular path.

A support member in the form of a cylindrical sleeve 160 is fixed to the outer surface of the supporting member 146. A shaft member 162 having a circular shape in transverse cross section is fitted in the cylindrical sleeve 160 such that the shaft member 162 is rotatable about a vertical axis (an axis of rotation of each suction nozzle 190 described below) relative to the cylindrical sleeve 160 and is axially movable together with the cylindrical sleeve 160. A first engaging member 174 is connected to the shaft member 162 through a rotation transmitting shaft 164 such that the first engaging member 174 is rotatable with the shaft member 162 and is axially movable relative to the shaft member 162. The first engaging member 174 is held stationary in the axial direction of the component-holding head 130 even when the head 130 is vertically moved by the roller 148 held in engagement with the cam groove of the cylindrical cam 140 while the head 130 is turned with the indexing disk 120. Namely, the first engaging member 174 is not vertically moved while the shaft member 162 is vertically moved with the cylindrical sleeve 160 by the supporting member 146.

The first engaging member 174 can be turned by a turning device including an externally toothed ring gear 176, about the axis of rotation of the indexing disk 120. Since the first engaging member 174 is flexibly connected to the shaft member 162 through a flexible-joint mechanism, the first engaging member 174 can be turned at a higher angular velocity than the indexing disk 120, so that the first engaging member 174 reaches each working position of each component-holding head 130 before the head 130 reaches each working position, as disclosed in JP-A-6-342998. Since, this aspect of the first engaging member 174 regarding its movement relative to the component-holding head 130 does not directly relate to the present invention, no further description in this respect is deemed necessary.

The shaft member 162 has a lower end portion which extends downwards from the sleeve 160 and which carries an attaching member 184 fixed thereto. A rotary nozzle holder 186 is supported by the attaching member 184, such that the rotary nozzle holder 186 is supported by a support shaft 188 (FIG. 6) rotatably about a horizontal axis perpendicular to the axis of the shaft member 162.

The rotary nozzle holder 186 includes a plurality of nozzle holders 192, more precisely, six nozzle holders 192, which are arranged equiangularly about the axis of rotation of the rotary nozzle holder 186 (about the support shaft 188). The six nozzle holders 192 are arranged to hold the respective six suction nozzles 190 such the suction nozzles 190 extend in the radial directions of the support shaft 188 at a predetermined angular interval. The rotary nozzle holder 186 is rotated about the support shaft 188 by a nozzle-holder selecting device (not shown) disposed near the above-indicated nozzle-holder selecting position, to bring a selected one of the six nozzle holders 192 into an operating or working position. In the operating position, the suction nozzle 190 held by the selected nozzle holder 192 faces downwards, and the axis of the suction nozzle 190 is aligned with the axis of the shaft member 162. With the nozzle holder 192 placed in the operating position, the suction nozzle 190 held by the nozzle holder 192 is placed in its operating position for holding and releasing the electronic component 38.

In the present embodiment, the shaft member 162, the attaching member 184 and the rotary nozzle holder 186 constitute each component-holding head 130 which holds the six suction nozzles 190. The component-holding head 130 is rotatable about the vertically extending axis of the shaft member 162 parallel to the axis of rotation of the indexing disk 120, and is arranged to hold the selected suction nozzle 190 placed in its operating position such that the selected suction nozzle 10 extends substantially in its axial direction. The component-holding head 130 may be considered to be constituted by the nozzle holder 192 holding the selected suction nozzle 190 placed in the operating position, the attaching member 184 and the shaft member 162.

The 16 component-holding heads 130 are identified by respective codes of head-code data, and the six nozzle holders 192 of each component-holding head 130 are also identified by respective codes of nozzle-holder-code data. Suction nozzle data indicative of the kinds of the suction nozzles 190 held by the respective nozzle holders 192 of each component-holding head 130 are stored in a ROM 404 of a control device 400 (which will be described), so that the specific kind of the selected suction nozzle 190 placed in its operating position of each component-holding head 130 can be identified on the basis of the above-indicated head-code data and nozzle-holder-code data, and the suction nozzle data.

Each component-holding head 130 and the suction nozzles 190 held by the head 130 cooperate to constitute a component mounting unit 194. Namely, the component mounting device 16 has 16 component mounting units 194 arranged equiangularly in the circumferential direction of the indexing disk 120. In FIG. 2, only two of the six suction nozzles 190 are shown for each of only two of the 16 component-holding heads 130, in the interest of simplification. The opening 26 of a selected one of the tape feeders 36 of the component supply device 14 is located below the selected suction nozzle 190 (placed in its operating position) of the component-holding head 130 located at the component receiving position. At the component supply position of the selected tape feeder 36, its component-supply portion 37 is located below the selected suction nozzle 190 of the component-holding head 130 located at the component receiving position, so that the electric component 38 is transferred from the component-supply portion 37 to the selected suction nozzle 190.

Each of the six suction nozzles 190 held by each component-holding head 130 is arranged to hold the electronic component 38 by suction under a negative pressure.

One of the suction nozzles 190 is shown in FIG. 6. Each suction nozzle 190 includes a nozzle body 198, and a suction pipe 200 the lower or free end face of which provides a sucking surface 201 for sucking the electronic component 38, as shown in FIG. 6. The suction nozzle 190 is removably held at its nozzle body 198 by the corresponding nozzle holder 192 such that the suction nozzle 190 is rotatable with the nozzle holder 192 and axially movable relative to the nozzle holder 192. When the electronic component 38 is sucked by the suction nozzle 190 or transferred from the suction nozzle 190 onto the printed-wiring board 60, the suction nozzle 190 is axially movable relative to the nozzle holder 192, with compression of a spring 202 interposed as a biasing device between the rotary nozzle holder 186 and the suction nozzle 190. The axial movement of the suction nozzle 190 relative to the nozzle holder 192 reduces an impact upon abutting contact of the suction nozzle 190 with the electronic component 38 or upon abutting contact of the electronic component 38 with the printed-wiring board 60. In the present embodiment, the six suction nozzles 190 held by each component-holding head 130 are different in kind from each other, but have the same length so that the sucking surfaces 201 of all the suction nozzles 190 lie substantially on a circle whose center lies on the axis of rotation of the rotary nozzle holder 186.

The selected suction nozzle 190 placed in its operating position is selectively communicated with a vacuum pump serving as a negative pressure source, an air pump serving as a positive pressure source, and the atmosphere. The electronic component 38 is sucked by the selected suction nozzle 190 when a negative pressure is applied form the vacuum pump to the suction nozzle 190. When a positive air pressure is applied from the air pump to the suction nozzle 190, the electronic component 38 is released from the suction nozzle 190. Selective communication of the suction nozzle 190 with the vacuum pump, air pump and atmosphere is affected by a mechanical switching action of a control valve in the form of a directional control valve 220 (FIG. 2) attached to the cylindrical sleeve 160.

As shown in FIG. 2, two head lifting and lowering devices 230, 232 are provided in respective portions of the frame 110 and the cylindrical cam 140, which portions correspond to the component receiving position 130A and the component mounting position 130F, respectively. Each head lifting and lowering device 230, 232 serves as an axial-nozzle-movement device operable to move the component-holding head 130 and the selected suction nozzle 190 in the axial direction, and as a device operable to move the component supply device 14 and the component-holding head 130 in the axial direction of the head 130 toward and away from each other.

The head lifting and lowering device 230 disposed at the component receiving position 130A will be briefly described by reference to FIG. 2. The head lifting and lower device 230 includes a movable member in the form of a vertically movable member 238 and a vertical drive device 240 operable to lift and lower the vertically movable member 238. The vertically movable member 238 is fitted in a guide groove 244 formed in the cylindrical cam 140 so as to extend in the axial direction of the indexing disk 120, such that the vertically movable member 238 is movable in the axial direction of the indexing disk 120. The vertically movable member 238 has, in its lower end portion, an engaging groove 252 which can be contiguous with the above-indicated cam groove formed in the cylindrical cam 140. When the vertically movable member 238 is placed at its upper stroke end, the engaging rove 252 becomes contiguous with the cam groove so that the roller 148 moves into the engaging groove 238, whereby the component-holding head 130 at the component receiving position 130A is supported by the vertically movable member 238.

The vertical drive device 240 includes a drive source in the for of the intermittent rotary drive motor 116 (FIG. 8), a motion converting device operable to convert a rotary motion of the intermittent rotary drive motor 116 into a vertical movement, and a motion transmitting device operable to transmit the vertical movement to the vertically movable member 238. The motion converting device includes a can in the form of a rotary cam 254, a cam follower in the form of a roller 256, and levers 258, 260. The motion transmitting device includes a connecting rod 262 and a spherical joint 264. Thus, the vertically movable member 238 is vertically moved by the vertical drive device 240, to lift and lower the component-holding head 130 and the selected suction nozzle 190. The vertical movement of the suction nozzle 190 and its turning movement about the axis of the indexing disk 120 in timed relation with each other are controlled by the configurations of the cam used in the rotary drive device 114 and the rotary cam 254. The vertical operating stroke of the vertically movable member 238 is adjusted to adjust the lowermost position of the component-holding head 130. Since this adjustment does not directly relate to the present invention, no further description in this respect is deemed necessary.

The vertically movable member 238 of the head lifting and lowering device 232 is not adjustable in its vertical operating stroke. Namely, the lowermost and uppermost positions of he component-holding head 130 at the component mounting position 130F are kept constant. In the other aspects, the lifting and lowering device 232 is identical with the lifting and lowering device 230. The same reference signs as used for the lifting and lowering device 230 are used for the functionally corresponding elements of the lifting and lowering device 232, which will not be described.

A component attitude changing device, a component hold-position rectifying device and an angular-head-position resetting device 300 (FIG. 5) are disposed at the component attitude changing position 130C, the component hold-position rectifying position 130E and the angular-head-position resetting device, respectively. The component attitude changing device is operated where the component-mounting angular position of the electronic component 38 in which the electronic component 38 is mounted on the printed-wiring board 60 is different from the component-receiving angular position in which the electronic component 38 is transferred from the component-supply portion 37 of the selected tape feeder 36 to the suction nozzle 190. The component attitude changing device is arranged to rotate the component-holding head 130 holding the electronic component 38 about its axis, to establish the component mounting angular position of the electronic component 38. The component hold-position rectifying device is arranged to rotate the component-holding head 130 about its axis, for rotating the selected suction nozzle 190 to adjust the angular position of the electronic component 38 as held by the suction nozzle 190, for an error of angular positioning of the electronic component 38 about an axis perpendicular to the sucking surface 201. The angular-head-position resetting device 300 is arranged to rotate the component-holding head 130 to its angular zero position after the head 130 has been rotated by the component attitude changing device and/or the component hold-position rectifying device. The component-holding head 130 is placed in the angular zero position when it is located at the component receiving position 130A.

Figure 5:
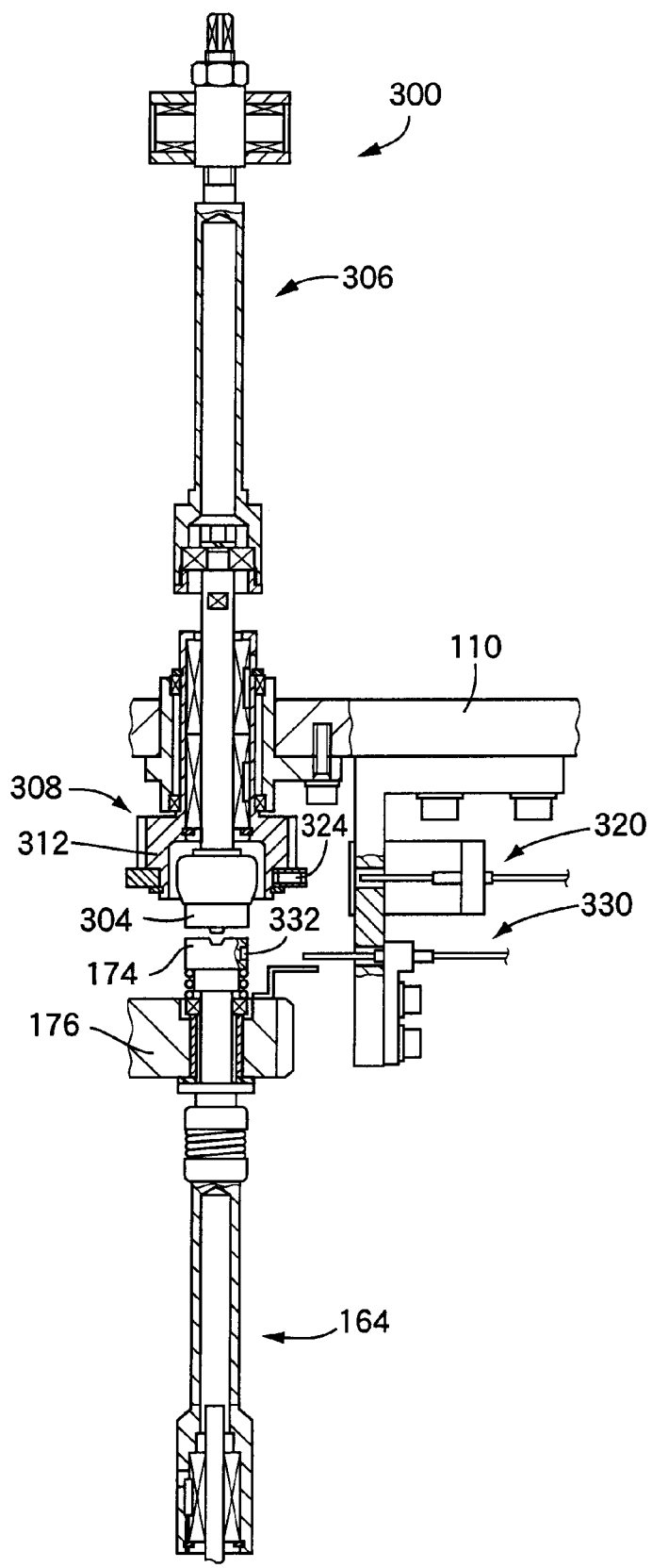
FIG. 5 is a front elevational view (partly in cross section) of an angular-head-position resetting device of the component mounting device.

The component attitude changing device, the component hold-position rectifying device and the angular-head-position resetting device 300 are all head rotating devices which are identical in construction with each other, in the present embodiment. Referring to FIG. 5, the angular-head-position resetting device 300 will be described by way of example. The resetting device 300 includes a second engaging member 304 supported by the frame 110 such that the second engaging member 304 is axially movable and rotatable relative to the frame 110. The resetting device 300 further includes a vertically moving device 306 and a rotating device 308. The vertically moving device 306 is arranged to move the second engaging member 304 in its axial direction, namely, in the vertical direction parallel to the axis of rotation of the indexing disk 120, for engagement and disengagement of the second engaging member 304 with and from the first engaging member 174 described above. The rotating device 308 is arranged to rotate the second engaging member 304.

The vertically moving device 306 includes a motion converting device including a cam and a cam follower for converting he rotary motion of the intermittent rotary drive motor 116 into a vertical movement, and a motion transmitting mechanism for converting the vertical movement to the second engaging member 304 for engagement and disengagement with and from the first engaging member 174. The rotating device 308 includes an angular-head-position resetting motor 310 (FIG. 8), rotary motion of which is transmitted to the second engaging member 304 through a motion transmitting device including a timing pulley 312, so that the second engaging member 304 is rotated about its vertically extending axis. The second engaging member 304 in engagement with the first engaging member 174 is rotated, so that a rotary motion of the second engaging member 304 is transmitted to the component-holding head 130 through the first engaging member 174 and the rotation transmitting shaft 164. Thus, the head 130 can be rotated by a desired angle in a selected one of the clockwise and counterclockwise directions.

The angular-head-position resetting device 300 is provided with a first angular-zero-position detecting device 320 for detecting the angular zero position of the second engaging member 304. The first angular-zero-position detecting device 320, which is attached to the frame 110, consists of a sensor of optical fiber type arranged to detect the angular zero position of the member 304, depending upon whether a light is reflected from a reflecting member 324 disposed on the timing pulley 312. A detecting device similar to the first angular-zero-position detecting device 320 is provided on the component attitude changing device and the component hold-position rectifying device.

The angular-head-position resetting device 300 is also provided with a second angular-zero-position detecting device 330 for detecting the angular zero position of the component-holding head 130. The detecting device 330 consists of a sensor of optical fiber type arranged to detect the angular zero position of the component-holding head 130, depending upon a light is reflected from a reflecting member 332 disposed on the outer circumferential surface of the first engaging member 174, which is fixed at the upper end of the rotation transmitting shaft 164 which is rotatable with the component-holding head 130. The second angular-zero-position detecting device 330 is provided for the angular-head-position resetting device 300. The component-holding head 130 is placed in its angular zero position when the head 130 located at the component receiving position 130A receives the electronic component 38 from the component supply device 14. When the component-holding head 130 is located at the angular-head-position resetting position 130G, the head 130 is rotated by the angular-head-position resetting device 300, to its angular zero position, namely, to its component-receiving angular position in which the head 130 is located at the component receiving position 130A. The detection of the angular zero position of the head 130 by the second angular-zero-position detecting device 330 assures that the head 130 is placed in its angular zero position or component-receiving angular position when the head 130 receives the electronic component 38 at the component receiving position 130A. Where the head 130 is not placed in its angular zero position when the head 130 is located at the component receiving position 130A, an alarm indicator is activated, or any other suitable measure is taken.

In the present embodiment, the first and second engaging members 174, 340 are engageable with each other at two angular positions which are spaced from each other by 180°. The first angular-zero-position detecting device 320 is adapted to detect the light reflected by the reflecting member 324 when the second engaging member 304 is placed in a predetermined one of the two angular positions in which the second engaging member 304 is engageable with the first engaging member 174 of the component-holding head 130 placed in the angular zero position. This predetermined angular position of the second engaging member 304 is the angular zero position of the member 304. The first angular-zero-position detecting device 320 provided for each of the component attitude changing device and the component hold-position rectifying device is adapted to detect the light reflected from the reflecting member 324 of the second engaging member 304 placed in the angular position for engagement with the first engaging member 174 corresponding to the component-holding head 130 placed in the angular zero position when this head 130 is located at the component attitude changing position 130C or component hold-position rectifying position 130E.

Figure 7:
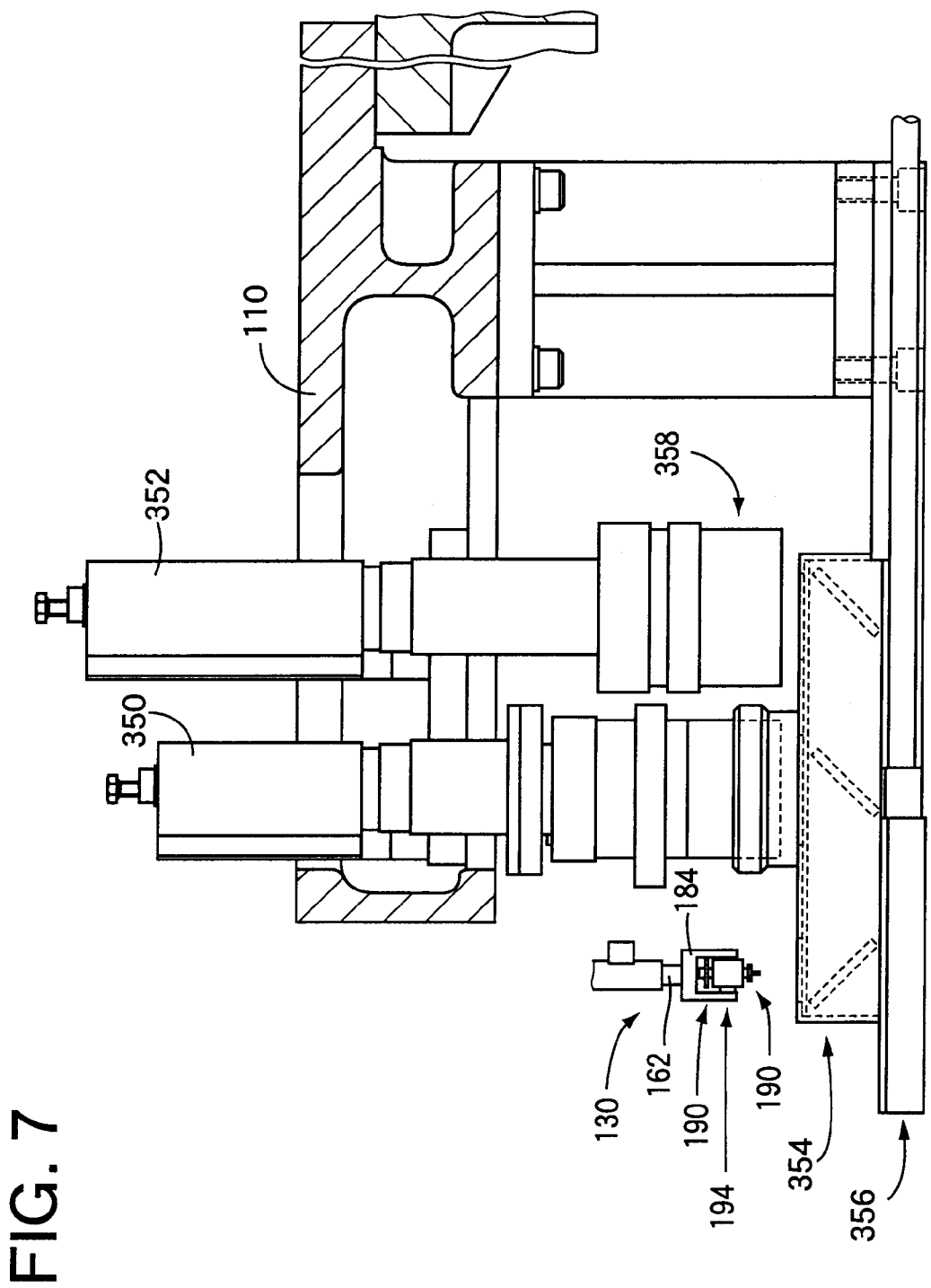
FIG. 7 is a front elevational view (partly in cross section) showing an imaging system arranged to take an image of an electronic component held by the component mounting device.

At the component hold-position detecting position, there are disposed two component cameras 350, 352, a waveguide device 354 and an illuminating device 356, as shown in FIG. 7. These component cameras 350, 352, waveguide device 354 and illuminating device 356 constitute an image-taking device 358. The component cameras 350, 352, which are constructed as disclosed in JP-A-5-196441, will be described only briefly.

Like the fiducial mark camera 90, each of the component cameras 350, 352 is a CCD camera which includes CCDs and a lens system and which is an image-taking device in the form of a surface-imaging device capable of taking a two-dimensional image of an object at one time. Each component camera 350, 352 has an imaging area perpendicular to its centerline and having a center lying on its centerline. The two component cameras 350, 352 have respective different ratios or times of magnification. The component camera 350 has a comparatively low magnification ratio but has a comparatively wide field of view, while the component camera 350 has a comparatively high magnification ratio but has a comparatively narrow field of view. The two component cameras 350, 352 are selectively used depending upon the size of the electronic component 38.

The two component cameras 350, 352 are supported by a circumferential portion of the frame 110 which is located radially outwardly of the indexing disk 120 and which corresponds to the component hold-position detecting position. The two component cameras 350, 352 are positioned radially outwardly of the indexing disk 120 and the component-holding head 130 located at the component hold-position detecting position, such that the centerlines of the cameras 350, 352 are parallel to each other and parallel to the vertically extending axis of rotation of the indexing disc 120 and are located on a straight line passing the axis of rotation of the indexing disc 120 and the axis of rotation of the component-holding head 130 located at the component hold-position detecting position, and such that the two component cameras 350, 352 face downwards, so that an image of an object is formed in the horizontal imaging area. Position adjusting devices (not shown) are provided to adjust the positions of the two component cameras 350, 352 in the radial and circumferential directions of the indexing disk 120 in the horizontal plane perpendicular to the centerlines of the cameras 350, 352, and the angular positions of the cameras 350, 352 about their centerlines. The adjustment of the positions of the component cameras 350, 352 will be described later.

At the component hold-position detecting position, the waveguide device 354 is disposed so as to extend from a position right below the component-holding head 130 located at the component hold-position detecting position, to positions right below the lower ends of the component cameras 350, 352. The waveguide device 354 includes reflecting mirrors for reflecting a light indicative of images of the electronic component 38 held by the suction nozzle 190 and other objects, to be incident upon the component cameras 350, 352. Thus, the image of the electronic component 38 is taken by the component cameras 350, 352, in the upward direction toward the electronic component 38.

The illuminating device 356 provided in the present embodiment is arranged to selectively irradiate the suction nozzle 190 with a visible light or a ultraviolet radiation, to take a silhouette image or a front image of the object. When the suction nozzle 190 is irradiated with the visible light, the visible light is reflected by the electronic component 38 held by the suction nozzle 190, so that a front image of the electronic component 38 is taken. When the suction nozzle 190 is irradiated with the ultraviolet radiation, the ultraviolet radiation is absorbed by a light emitting surface 360 provided on the suction nozzle 190, and the light emitting surface 360 emits a visible light with which the upper surface of the electronic component 38 is irradiated so that a silhouette image of the electronic component 38 is taken. The light emitting surface 360 is coated with a fluorescent material for converting the ultraviolet radiation into the visible light. The component cameras 350, 352, waveguide device 354 and illuminating device 356 cooperate to constitute an imaging system.

In the electronic-component mounting system 12 according to the present embodiment, there is established by the XY coordinate system wherein the X-axis and Y-axis directions are respectively parallel to the horizontal and vertical directions as seen in the plan views of FIGS. 1 and 4 wherein the component supply device 14 is located above the PWB support device 18, as described above. The upward and rightward directions as seen in FIG. 4 are positive X-axis and Y-axis directions, respectively. The XY plane is the horizontal plane. On the other hand, the imaging area of each component camera 350, 352, there is established an XY coordinate system wherein the Y-axis direction is parallel to the horizontal straight line which passes the axis of rotation of the indexing disk 120 and the axis of rotation of the component-holding head 130 located at the component hold-position detecting position, as indicated in FIG. 4, while the X-axis direction is perpendicular to the Y-axis direction in the horizontal plane. In the XY coordinate system of the component cameras 350, 352, the radially inward direction of the indexing disk 120 is a positive Y-axis direction, while the direction corresponding to the counter-clockwise direction at the component hold-position detecting position as seen in FIG. 4 is a positive X-axis direction.

As described below, various positioning errors such as the positioning error of the electronic component 38 as held by the suction nozzle 190 are detected on the basis of the images of the electronic component 38, etc. taken by the component cameras 350, 352, for compensating the movement data of the PWB support device 18, etc. Those positioning errors detected at the component hold-position detecting position must be converted into positioning errors at the component receiving position 130A and positioning errors at the component mounting position 130F, depending upon a positional difference between the component hold-position detecting position and the component receiving position 130A, and a positional difference between the component hold-position detecting position and the component mounting position 130F.

For mounting the electronic component 38 on the printed-wiring board 60, an image of the electronic component 38 as viewed in the downward direction is necessary. However, the image of the electronic component 38 is taken in the upward direction by the component cameras 350, 352. This must also be taken into account. An image of the object to be formed in the imaging area of each component camera 350, 352 is rotated 180° about the X axis with respect to the downward orientation of the camera 350, 352. Accordingly, the attitude of the image of the object taken by the component camera 350, 352 in the upward direction is the same in the X-axis direction as that of an image taken in the downward direction, but is reversed in the Y-axis direction to that of the latter image, with respect to the X axis. This reversal of the image in the Y-axis direction must also be taken into account when the movement data of the PWB support device 18, etc. are compensated for the various positioning errors detected on the basis of the images of the electronic component 38, etc.

Figure 8:
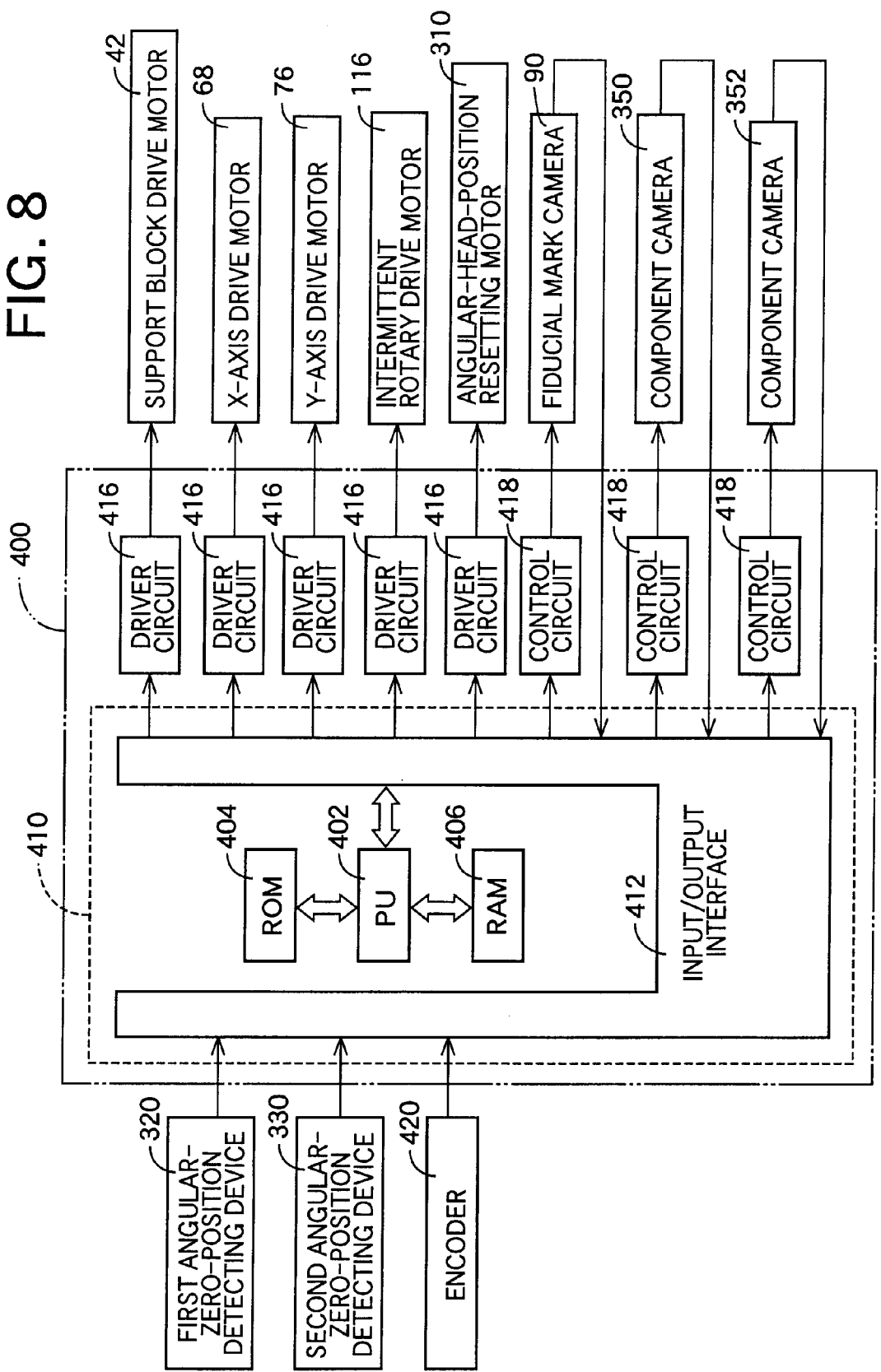
FIG. 8 is a block diagram showing a part of a control device for controlling the electronic-component mounting system, which part largely relates to the present invention.

The present electronic-component mounting system 12 includes a control device 400 illustrated in FIG. 8. The control device 400 is constituted principally by a computer 410 incorporating a processing unit (PU) 402, a read-only memory (ROM) 404, a random-access memory (RAM) 406, and a bus interconnecting the elements 402, 404, 406. To the bus, there is connected an input/output interface 412 to which are connected the first angular-zero-position detecting device 320, the second angular-zero-position detecting device 330, and various sensors such as an encoder 420.

To the input/output interface 412, there are also connected the support block drive motor 42 and various other actuators 68, 76, 116, 310 through respective driver circuits 416. These actuators 42, 68, 76, 116, 310 serving as drive sources are electric motors, more specifically, rotary electric motors in the form of servomotors the amounts of operation of which can be controlled with high accuracy. Stepping motors rather than the servomotors may be used as those actuators. The operating amounts of the actuators 42, etc. are detected by respective rotary encoders the output signals of which are used to control the actuators. Of these encoders, only the encoder 420 for the support block drive motor 42 is shown in FIG. 8.

To the interface 412, there are also connected the fiducial mark camera 90 and the component cameras 350, 352 through respective control circuits 418. The driver circuits 416, control circuits 418 and computer 410 constitute the control device 400. The RAM 406 is used to store various control programs which are down-loaded from a host computer, for instance, and to temporarily store various kinds of data. The control programs include a control program for mounting the electronic component 38 on the printed-wiring board 60, a control program for detecting the position of the rotation axis of the component-holding head 130, and a control program for detecting the positioning error of the sucking surface 201 of the suction pipe 200.

Basic operations of the electronic-component mounting system 12 to mount the electronic component 38 on the printed-wiring board 60 are well known in the art, as disclosed in JP-B2-8-21791, and will be briefly described.

When the electric component 38 is mounted on the printed-wiring board 60, the component-holding head 130 located at the component receiving position 130A is lifted by the head lifting and lowering device 230, so that the selected suction nozzle 190 placed in its operating position picks up the electronic component 38 by suction. At this time, the component-holding head 130 located at the component receiving position 130A is placed in its angular zero position, for the selected suction nozzle 190 to receive the electronic component 38 from the component-supply portion 37. Then, the component-holding head 130 is stopped at the component upright attitude detecting position 130B to determine whether the electronic component 38 held by the suction nozzle 190 stands upright with one of its side faces in contact with the sucking surface 201 of the suction pipe 200. Normally, the electronic component 38 lies flat with one of its opposite major surfaces in contact with the sucking surface 201. At the component attitude changing position 130C, the angular position of the electronic component 38 is changed if necessary to establish the predetermined component-mounting angular position, by rotating the component-holding head 130 from its angular zero position. Before the component-holding head 130 is rotated, the second engaging member 304 placed in the angular zero position is brought into engagement with the first engaging member 170 of the head 130 placed in the angular zero position, so that the head 130 can be rotated by the rotating device 308.

When the component-holding head 130 is stopped at the component hold-position detecting position 130D, an image of the electronic component 38 is taken by one of the component cameras 350, 352. The image of the electronic component 38 taken is compared with a reference or nominal image, to calculate XY positioning errors $\Delta XE$ and $\Delta YE$ and an angular positioning error $\Delta\theta$ of the electronic component 38. The XY positioning errors $\Delta XE$ and $\Delta YE$ are X-axis and Y-axis errors of a predetermined sucking position 38A of the electronic component 38 with respect to the axis of rotation of the component-holding head 130 in the XY or horizontal plane, as described below in detail by reference to FIG. 13, while the angular positioning error $\Delta\theta$ is an error of the angular position of the electronic component 38 about a vertical axis perpendicular to the sucking surface 201 of the suction nozzle 190. At the component hold-position rectifying position 130E, the suction nozzle 190 is rotated by the component hold-position rectifying device, to adjust the angular position of the electronic component 38 for compensation for the angular positioning error $\Delta\theta$. If the angular position of the electronic component 38 has been changed at the component attitude changing position 130C, the second engaging member 304 of the component hold-position rectifying device is rotated to an angular position in which the second engaging member 304 is engageable with the first engaging member 174 of the component-holding head 130 which has been rotated at the component attitude changing position 130C. If the angular position of the electronic component 38 has not been changed at the component attitude changing position 130C, the second engaging member 304 placed in its angular zero position is engageable with the first engaging member 174, for rotating the head 130 at the component hold-position rectifying position 130E. The compensation of the angular position of the electronic component 38 for the angular positioning error $\Delta\theta$ is affected while taking into account the positional difference between the component hold-position detecting position 130D and the component hold-position rectifying position 130E, and the reversal in the Y-axis direction of the image of the electronic component 38 taken by the component camera 350, 352 in the upward direction.

Distances of movements of the PWB support device 18 in the X-axis and Y-axis directions for mounting the electronic component 38 on the printed-wiring board 60 are adjusted for compensation for the XY positioning errors $\Delta XE$ and $\Delta YE$. The PWB support device 18 is moved by the board positioning device 64 to move the printed-wiring board 60 so that a component mounting position 130F on the board 60 at which the electronic component 38 is to be mounted is aligned with the component mounting position 130F of the component-holding head 130. The movement distances of the PWB support device 18 are compensated for the XY positioning errors $\Delta XE$ and $\Delta YE$. This compensation is affected while taking into account the XY positioning errors $\Delta XP$ and $\Delta YP$ of the printed-wiring board 60, and the positioning error of the sucking position 38A of the electronic component 38 which has been caused by the angular position adjustment at the component hold-position rectifying position 130E for compensation for the angular positioning error $\Delta\theta$. The XY positioning errors $\Delta XP$ and $\Delta YP$ of the component mounting position 130F on the printed-wiring board 60 are calculated on the basis of XY positioning errors of the board 60 which have been obtained on the basis of an image of the fiducial mark 88 on the board 60 taken by the fiducial mark camera 90 prior to the mounting operation of the electronic component 38. The positioning error of the sucking position 38A of the electronic component 38 due to the adjustment of its angular position is obtained on the basis of the position of the rotation axis A of the selected suction nozzle 190, and the angular positioning error $\Delta\theta$ and the XY positioning errors of the electronic component 38. The manner of obtaining the position of the rotation axis A of the suction nozzle 190 will be described later. The adjustment of the movement distances of the PWB support device 18 is affected while taking into account the positional difference between the component hold-position detecting position 130D and the component mounting position 130F, and the reversal in the Y-axis direction of the image of the electronic component 38 taken by the component camera 350, 352 in the upward direction.

At the component mounting position 130F, the suction nozzle 190 is lowered by the head lifting and lowering device 232, to mount the electronic component 38 onto the printed-wiring board 60. Then, the component-holding head 130 is stopped at the angular-head-position resetting position 130G at which the head 130 is rotated by the angular-head-position resetting device 300, to its angular zero position or component-receiving angular position. At the angular-head-position resetting position 130G, the second engaging member 304 of the angular-head-position resetting device 300 is rotated by an angle determined on the basis of the angular positioning error $\Delta\theta$ of the electronic component 38 and its angle of rotation to establish the component-mounting angular position, so that the second engaging member 304 is placed in an angular position in which the second engaging member 304 is engageable with the first engaging member 174, for rotating the component-holding head 130 to its angular zero position.

When the suction nozzle 190 receives the electronic component 38 from the component supply device 14, for mounting the electronic component 38 on the printed-wiring board 60, as described above, the component supply table 30 or 32 of the components supply device 14 is moved by the table positioning device 46, to bring the component-supply portion 37 of a selected one of the tape feeders 36 to the component supply position. The electronic components 38 are supplied in a predetermined order from the two or more tape feeders 36, and the component supply table 30 or 32 is moved according to table movement data determined by the predetermined order of supply of the electronic components 38, so that the component-supply portion 37 of the tape feeder 36 from which the electronic component 38 is to be supplied next is located at the component supply position right below the component-holding head 130 located at the component receiving position 130A. The table movement data are defined in the XY coordinate system of the electronic mounting system 12.

The X-axis position of the selected tape feeder 36 at which the electronic component 38 is picked up by the suction nozzle 190 is determined and adjusted on the basis of the predetermined sucking position 38A of the electronic component 38, the positioning error of the selected tape feeder 36, the positioning error of the axis of rotation of the component-holding head 130 (hereinafter referred to as "head axis"), and the positioning error of the sucking surface 201 of the suction nozzle 190 with respect to the head axis, so that the electronic component 38 can be held by suction by the suction pipe 200, with high stability and a minimum distance of deviation of the electronic component 38 in the X-axis direction in which the component supply table 30, 32 is moved. The positioning error of the sucking surface 201 with respect to the head axis is caused by eccentricity of the suction pipe 200 with respect to the nozzle body 198, and bending of the suction pipe 200, although the suction pipe 200 and the nozzle body 198 are designed to be concentric with each other.

The predetermined sucking position 38A of the electronic component 38 is known from the specific kind of the electronic component 38, and the table movement data are prepared on the basis of the known sucking position 38A of the electronic component 38. The positioning error of the head axis and the positioning error of the sucking surface 201 with respect to the head axis are detected, and the table movement data are adjusted or modified on the basis of the detected positioning errors of the head axis and the sucking surface 201. The detection of the positioning errors is affected while the electronic-component mounting system 12 is not in the component mounting operation, for instance, during manufacture, maintenance inspection or daily pre-operation inspection of the mounting system 12, or upon replacement of the suction nozzle or nozzles 190, or alternatively, during an interruption of a continuous component mounting operation. Where the positioning errors are detected during an interruption of the continuous component mounting operation, the detection is initiated when at least one predetermined condition of the mounting system 12 is satisfied. For instance, the detection is initiated when at least one of the following conditions is satisfied: that the cumulative operating time of the mounting system 12 has exceeded a predetermined threshold; that the number of the electronic components 38 which have been mounted on the printed-wiring board 60 has exceeded a predetermined threshold; and that the number of the printed-wiring boards 60 on which the electronic components 38 have been mounted has exceeded a predetermined threshold. However, it is not essential to initiate the detection of the positioning errors when the predetermined condition is satisfied. Further, any other condition in addition to the conditions described above by way of example may be used. If a given predetermined condition is satisfied before all of the predetermined electronic components 38 have been mounted on a given printed-wiring board 60, for instance, the detection of the positioning errors may be initiated after the mounting of all of the electronic components 38 on that board 60 is completed. In this instance, the detection of the positioning errors may be considered to be initiated during an interruption of a continuous component mounting operation on a plurality of printed-wiring boards 60. Alternatively, the detection of the positioning errors may be initiated by interrupting the continuous component mounting operation upon generation of a trigger signal from suitable commanding means. The commanding means may be an input device operable by the operator of the mounting system 12, or means responsive to a command received from a host computer. The positioning errors detected during an interruption of the continuous component mounting operation include positioning errors caused by thermal expansion of the various parts of the mounting system 12 due to a temperature rise of those parts, or include a change in the positioning errors caused by the thermal expansion. The positioning error of each tape feeder 36 is detected on the basis of an image of the electronic component 38 held by the suction nozzle 190, as described below, and the movement data used for positioning the component supply table 30, 32 are adjusted or modified on the basis of the detected positioning error of the tape feeder 36, when the relevant electric component 38 is mounted on the printed-wiring board 60. There will be described the manner of detecting the positioning errors and the manners of preparing and adjusting the table movement data. In the present embodiment, the detection of the positioning errors and the preparation of the table movement data are affected upon a daily pre-operation inspection of the mounting system 12, upon satisfaction of the predetermined condition, and upon replacement of the suction nozzles 190. Initially, the detection of the positioning errors upon the daily pre-operation inspection will be described.

The sucking position 38A of the electronic component 38, which is one of the elements used to prepare and adjust the movement data for the tape feeder 36, is determined depending upon the specific shape and dimensions of each electronic component 38, for each kind of the electronic component 38. According to the thus determined sucking position 38A of each electronic component 38, the table movement data are prepared. Alternatively, standard table movement data prepared without taking account of the sucking position 38A of the specific electronic component 38 may be modified on the basis of the sucking position 38A of the specific electronic component 38.

Figure 9:
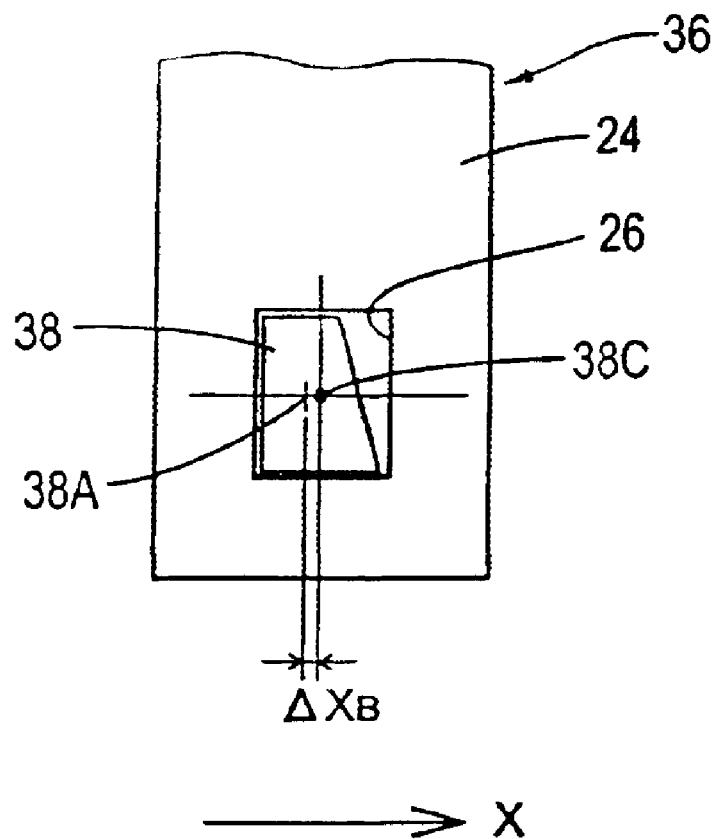
FIG. 9 is a view for explaining a sucking position of the suction nozzle at which the electronic component is held by suction by the suction nozzle when the electronic component is positioned at a component-supply portion of the tape feeder of the component supply device.

The predetermined sucking position 38A of the specific electronic component 38 is a portion of that electronic component 38 at which the electronic component 38 can be held by the suction nozzle 190 with the highest degree of stability. This portion (sucking position) is not necessarily a central portion of the electronic component 38, and may be offset from the center position of an ordinary electronic component, as indicated in FIG. 9. The ordinary electronic component, which has a rectangular or square shape in transverse cross section, has its center position which is a midpoint in both of the width direction and the length direction. In the present application, the reference sign 38 denotes all kinds of electronic components, namely, the ordinary electronic components and the other electronic components. The carrier tape 22 is held by the tape feeder 36 such that the center of the ordinary electronic component 38 as seen in the width direction (in the X-axis direction) is located at the center of the opening 26 of the covering member 24 as seen in the X-axis direction. Where the electronic component is not the ordinary electronic component 38, the predetermined sucking position 38A is offset from the center position of the ordinary electronic component 38 by an offset distance $\Delta XB$ in the X-axis direction. That is, the predetermined sucking position 38A of the electronic component 38 is defined by the offset distance $\Delta XB$ of the sucking position 38A to the widthwise center 38C of the electronic component 38 in the X-axis direction. This offset distance $\Delta XB$ defining the sucking position 38A is defined with a positive or negative sign, in the XY coordinate system established for the mounting system 12. The table movement data are prepared according to the thus defined offset distance $\Delta XB$. Although the position at which the electronic component 38 can be suitably sucked may be offset from the center of the electronic component 38 in the Y-axis direction, the sucking position 38A is not set in the Y-axis direction, since the component supply tables 30, 32 are movable in the X-axis direction only. The electronic component 38 is held by the suction nozzle 190, at a Y-axis position determined by the component supply device 14, so that the electric component 38 is sucked at its central portion. The sign of the value of the offset distance $\Delta XB$ is determined with the X-axis zero point being located at the center point of the electric component 38 in the XY coordinate system of the electric-component mounting system 12. In FIG. 9, the opening 26 of the covering member 24 is only schematically shown.

There will next be described the manner of detecting the positioning error of the head axis (axis of rotation of the component-holding head 130). To detect the positioning error of the head axis, one of the plurality of suction nozzles 190 held by one of the plurality of component-holding heads 130 is selected as a reference suction nozzle whose axis of rotation is used to detect the positioning errors of the head axis of the suction nozzles 190 other than the reference suction nozzle, since the axis of rotation of the reference suction nozzle is used as a basis for setting the zero positions of the various movable members or devices of the mounting system 12 such as the component supply tables 30, 32 and the board positioning device 64. Although all of the six suction nozzles 190 held by each component-holding head 130 theoretically have the same axis of rotation, the six suction nozzles 190 when placed in their operating position may have different axes of rotation due to a manufacturing error or for any other reason. In view of this, the positioning errors of the rotation axis of all of the suction nozzles 190 other than the reference suction nozzle are detected with respect to the rotation axis of the reference suction nozzle. Accordingly, the rotation axis of one suction nozzle 190 on one component-holding head 130 may differ from the rotation axis of another suction nozzle 190 on the same head 130. The rotation axis of the presently selected suction nozzle 190 which is presently selected on the component-holding head 130 and which is placed in the operating position for mounting the electronic component 38 is used as the rotation axis of that head 130.

Initially, the position of the axis of rotation of the reference suction nozzle is detected on the basis of two front images of the sucking surface 301 of the reference suction nozzle taken by each of the two component cameras 350, 352 at respective two different angular positions of the relevant component-holding head 130. Like the image electronic component 38 held by the suction nozzle 190, the image of the sucking surface 201 of the reference suction nozzle at each of the two different angular positions is taken by each component camera 350, 352 in the upward direction, that is, in the axial direction of the component-holding head 130 toward the sucking surface 201. As described above, the component cameras 350, 352 are positioned radially outwardly of the indexing disk 120 and the component-holding head 130 located at the component hold-position detecting position 130D, and are oriented so as to face downwards. The light indicative of an image of the object such as the sucking surface 201 is guided by the waveguide device 354, so as to be incident upon the component cameras 350, 352, so that the image is taken in the upward direction toward the object. In the present embodiment, the two different angular positions of the component-holding head 130 holding the reference suction nozzle 190 consist of the angular zero position established at the component receiving position 130A (component-receiving angular position), and an angular position which is angularly spaced by 180° from the component-receiving angular position.

After the images of the sucking surface 201 of the reference suction nozzle 190 placed in the component-receiving angular position are taken by the component cameras 350, 352, the component-holding head 130 is moved to the angular-head-position resetting position 130G by rotation of the indexing disk 120. At this angular-head-position resetting position 130G, the component-holding head 130 is rotated by 180° by the angular-head-position resetting device 300, and the images of the sucking surface 201 are taken again by the component cameras 350, 352. Thus, the component-holding head 130 located at the angular-head-position resetting position 130G is placed in the angular position of 180° with respect to the angular zero position, for the purpose of taking the images of the sucking surface 201 of the reference suction nozzle. Even if the second angular-zero-position detecting device 330 detects that the component-holding head 130 is not placed in the angular zero position at the angular-head-position resetting position 130G, the angular-head-position resetting device 300 is not operated to establish the angular zero position before the images of the sucking surface 201 are taken.

Figure 10A:
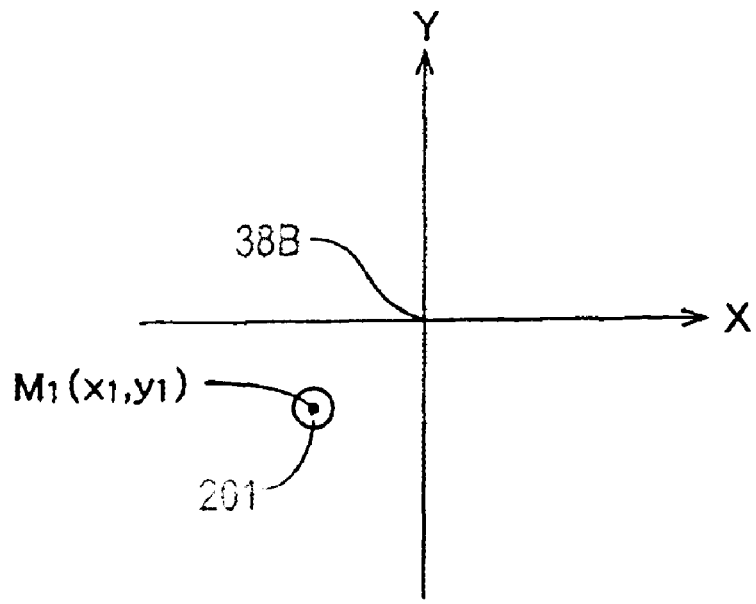
FIGS. 10A and 10B are views for explaining a manner of detecting the axis of rotation of the suction nozzle.
Figure 10B:
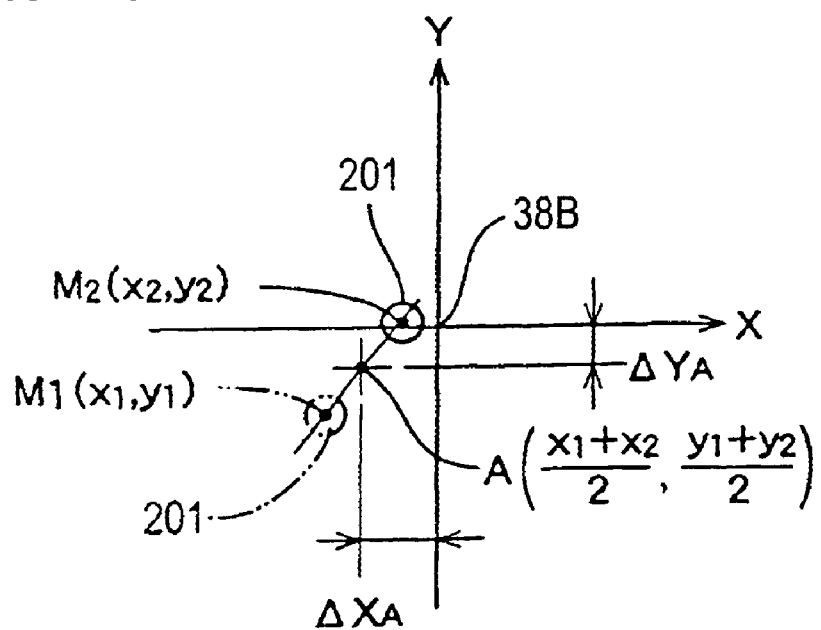

FIG. 10A indicates an example of the first image of the sucking surface 201 of the reference suction nozzle 190 taken by the component camera 350 when the component-holding head 130 is located at the angular zero position, and FIG. 10B indicates not only the first image, but also an example of the second image of the sucking surface 201 also taken by the component camera 350 when the head 130 is located at the angular-head-position resetting position 130G which is 180° apart from the angular zero position. Suppose a center point M1 of the first image has X-axis and Y-axis coordinate values (x1, y1) while a center point M2 of the second image has X-axis and Y-axis coordinate values (x2, y2), the axis of rotation A of the reference suction nozzle 190 is located at a midpoint between the two center points M1, M2, which has X-axis and Y-axis coordinate values {(x1+x2)/2, (y1+y2)/2}. Then, error distances ΔXA and ΔYA between the rotation axis A and a center of the imaging area 38B of the component camera 350 are obtained and indicated on a suitable display device (not shown), so that the operator of the mounting system 12 can adjust the position of the component camera 350, while observing the indicated error distances ΔXA and ΔYA, for alignment of the center of the imaging area 38B with the rotation axis A of the reference suction nozzle 190. In FIGS. 10A and 10B and the following figures, the images of the objects such as the sucking surface 201 are denoted by the same reference signs as used for the objects, in the interest of easier understanding. After the second image of the sucking surface 201 is taken, the component-holding head 130 is further rotated by 180° by the angular-head-position resetting device 300 at the angular-head-position resetting position 130G, so that the head 130 is returned to its angular zero position or component-receiving angular position. Similarly, the first and second images of the sucking surface 201 of the reference suction nozzle 190 are taken by the component camera 352, and the position of the component camera 352 in the horizontal plane is adjusted so as to eliminate the detected error distances between the rotation axis A of the reference suction nozzle 190 and the center of the imaging area 38B of the component camera 352.

After the positions of the component cameras 350, 352 in the horizontal or XY plane perpendicular to their centerlines have been adjusted, the angular positions of the cameras 350, 352 about their centerlines are adjusted. To adjust the angular positions of the component cameras 350, 352, a suitable adjusting jig (not shown) is fixed on one of the nozzle holders 192, in place of the suction nozzle 190. For example, the adjusting jig includes a mounting portion at which the adjusting jig is mounted on the nozzle holder 192, and a reference-surface portion for adjusting the angular position of each component camera 350, 352. The mounting portion has a circular shape in transverse cross section, while the reference-surface portion has a square or rectangular shape in transverse cross section. The reference-surface portion has mutually perpendicular two vertically extending reference side surfaces which are parallel to the centerline of the mounting portion and which are made parallel to the X-axis and Y-axis directions when the angular position of each component camera 350, 352 is adjusted as described below.

The adjusting jig is mounted on the nozzle holder 192 of the rotary nozzle holder 186, such that the adjusting jig is rotatable relative to the nozzle holder 192. The adjusting jig is moved to the component mounting position 130F by rotation of the indexing disk 120. At the component mounting position 130F, the adjusting jig is rotated about its axis to an angular position in which the two side surfaces of the adjusting jig are parallel to the X-axis and Y-axis directions, respectively. To confirm the parallelism of the side surfaces to the X-axis and Y-axis directions, a dial indicator is fixed on the Y-axis slide 82 such that the plunger of the dial indicator is held in contact with the side surface of the adjusting jig substantially parallel to the Y-axis direction, for instance. The parallelism can be confirmed by reading the dial indicator while the Y-axis slide 82 is moved in the Y-axis direction. If the reading of the dial indicator whose plunger is held in contact with the above-indicated side surface remains constant when the Y-axis slide 82 is moved in the Y-axis direction, this means that the above-indicated side surface is parallel to the Y-axis direction.

After the angular position of the adjusting jig is adjusted such that the two side surfaces of the adjusting jig are parallel to the respective X-axis and Y-axis directions, the component-holding head 130 with the adjusting jig mounted on the rotary nozzle holder 186 is moved to the component hold-position detecting position 130D. At this position, front images of the reference-surface portion of the adjusting jig are taken by the component cameras 350, 352, and image data representative of the front images are processed to calculate the positioning errors of the angular position of the imaging areas of the cameras 350, 352 with respect to the reference-surface portion of the adjusting jig. The calculated angular positioning errors are indicated on a display device, so that the operator of the mounting system 12 can adjust the angular positions of the component cameras 350, 352, while observing the indicated angular positioning errors, so as to zero the angular positioning errors.

The adjustments of the XY positions and the angular position of the component cameras 350, 352 are affected while the mounting system 12 is not in the component mounting operation, for instance, during manufacture, maintenance inspection or daily pre-operation inspection of the mounting system 12. In the present embodiment, the detection of the positioning error of the head axis and other positioning errors and the adjustment of the angular positions of the component cameras 350, 352 are affected during the daily pre-operation inspection of the mounting system 12, so that the centers of the imaging areas of the component cameras 350, 352 are aligned with the rotation axis of the reference suction nozzle before the component mounting operation is initiated.

Like the axis of rotation of the reference suction nozzle 190, the axes of rotation of the suction nozzles 190 other than the reference suction nozzle 190 are detected on the basis of images of the sucking surfaces 201 of those other suction nozzles 190, which are taken by the component cameras 350, 352 whose positions have been adjusted as described above. The positioning errors of the rotation axes of the other suction nozzles 190 (hereinafter referred to as "ordinary suction nozzles 190") with respect to the rotation axis A of the reference suction nozzle 190 are obtained.

Each of the ordinary suction nozzles 190 is placed in its operating position, and two front images of the sucking surface 201 of each ordinary suction nozzle 190 are taken by each of the component cameras 350, 352 at respective two different angular positions of the relevant component-holding head 130. The two angular positions consist of the component-receiving angular position, and an angular position which is angularly spaced 180° from the component-receiving angular position. The midpoint between the center points of the two front images of the sucking surface 201 taken at the two angular positions is determined as the position of the axis of rotation of each ordinary suction nozzle 190, and the positioning error of the thus determined axis of rotation of each ordinary suction nozzle 190 with respect to the center of the imaging area 38B of each component camera 350, 352 is obtained. Since the center of the imaging area 38B of each component camera 350, 352 has been aligned with the axis of rotation of the reference suction nozzle, the positioning error of the rotation axis A of each ordinary suction nozzle 190 with respect to the center of the imaging area 38B represents the positioning error of the rotation axis of each ordinary suction nozzle with respect to the rotation axis of the reference suction nozzle.

In the present embodiment, the two images of each of the presently selected ordinary suction nozzles 190 in the operated position on all of the 16 component-holding heads 130 are taken at the respective two angular positions of each head 130. Then, another ordinary suction nozzle 190 of each head 130 is placed in the operated position, and the two images of this ordinary suction nozzle 190 of each head 130 are taken at the respective two angular positions. Similar imaging operations are repeated until the two images of each of all ordinary suction nozzles 190 have been taken at the respective two angular positions.

Initially, the ordinary suction nozzles 190 held by the #1 nozzle holders 192 (except the #1 nozzle holder 192 holding the reference suction nozzle 190) of the component-holding heads 130 are sequentially moved to the component hold-position detecting position 130D, and the image of the sucking surface 201 of each ordinary suction nozzle 190 is taken in the upward direction by each component camera 350, 352 while each head 130 is placed in its first imaging angular position, namely, in the component-receiving angular position. The head 130 holding the ordinary suction nozzle 190 whose image has been taken is moved to the angular-head-position resetting position 130G, at which the head 130 is rotated by 180° by the angular-head-position resetting device 300. The same head 130 is moved again to the component hold-position detecting position 130D, at which the image of the sucking surface 201 is again taken while the head 130 is placed in its second imaging angular position which is 180° spaced from the first imaging angular position. The second engaging member 304 of the angular-head-position resetting device 300 is engageable with the first engaging member 174, at two angular positions 180°-spaced from each other, namely, at the angular zero position or the angular position 180°-spaced from this angular zero position, so that the component-holding head 130 placed in the component-receiving angular position or the angular position 180°-spaced from this component-receiving angular position can be rotated by the angular-head-position resetting device 300.

After the second image of the sucking surface 201 is taken at the second imaging angular position of the component-holding head 130, the head 130 is moved again to the angular-head-position resetting position 130G, at which the head 130 is rotated by 180° to the component-receiving angular position (first imaging angular position). The head 130 is then moved to the nozzle-holder selecting position 130J, at which the rotary nozzle holder 186 is rotated by the nozzle-holder selecting device, to place the ordinary suction nozzle 190 held by the #2 nozzle holder 192 in the operating position, and the two images of the sucking surface 201 of this ordinary suction nozzle 190 are taken in the same manner as described above. The ordinary suction nozzles 190 of each head 130 are selectively placed in their operating position while the head 130 is placed in its component-receiving angular position 130H, so that the first image of each ordinary suction nozzle 190 is taken at the component-receiving angular position 130H of the corresponding head 130. This is also true for the reference suction nozzle 190. The same imaging operations are performed for all of the ordinary suction nozzles 190 of all of the component-holding heads 130, to take the two images of the sucking surface 201 of each ordinary suction nozzle 190 at the respective two angular positions, and the position of the axis of rotation of each ordinary suction nozzle 190 is detected.

After the positions of the rotation axes of the ordinary suction nozzles 190 have been detected, the positioning errors of the rotation axes of the ordinary suction nozzles 190 with respect to the center of the imaging area 38B of each component camera 350, 352 are obtained, in the same manner as the positioning errors of the rotation axis Aref of the reference suction nozzle 190 with respect to the center of the imaging area 38B. The thus obtained positioning errors of the rotation axes of the ordinary suction nozzles 190 with respect to the center of the imaging area 38B of each component camera 350, 352 represent the positioning errors of the rotation axes of the ordinary suction nozzles with respect to the rotation axis Aref of the reference suction nozzle. The obtained positioning error of the rotation axis of each ordinary suction nozzle are stored in the RAM 406, together with the code data of the corresponding head 130, the code data of the corresponding nozzle holder 192 and the data identifying the component camera 350, 352. The positioning error of the rotation axis Aord of each ordinary suction nozzle 190 is represented by error distances $\Delta XA$ and $\Delta YA$, like the positioning error of the rotation axis A of the reference suction nozzle. As described above, the electronic component 38 is rotated for compensation for the angular positioning error $\Delta \theta$ when the electronic component 38 is mounted on the printed-wiring board 60. The positioning error of the sucking position 38A of the electronic component 38 due to this rotation for compensation for the angular positioning error $\Delta \theta$ is calculated on the basis of the axis of rotation of each suction nozzle which is obtained as described above. To calculate this center of the sucking position 38A of the electronic component 38, the position of the axis of rotation Aord of each ordinary suction nozzle 190 is calculated on the basis of the axis of rotation Aref of the reference suction nozzle and the positioning error of the axis of rotation Aord of each ordinary suction nozzle with respect to the axis of rotation Aref.

Figure 11:
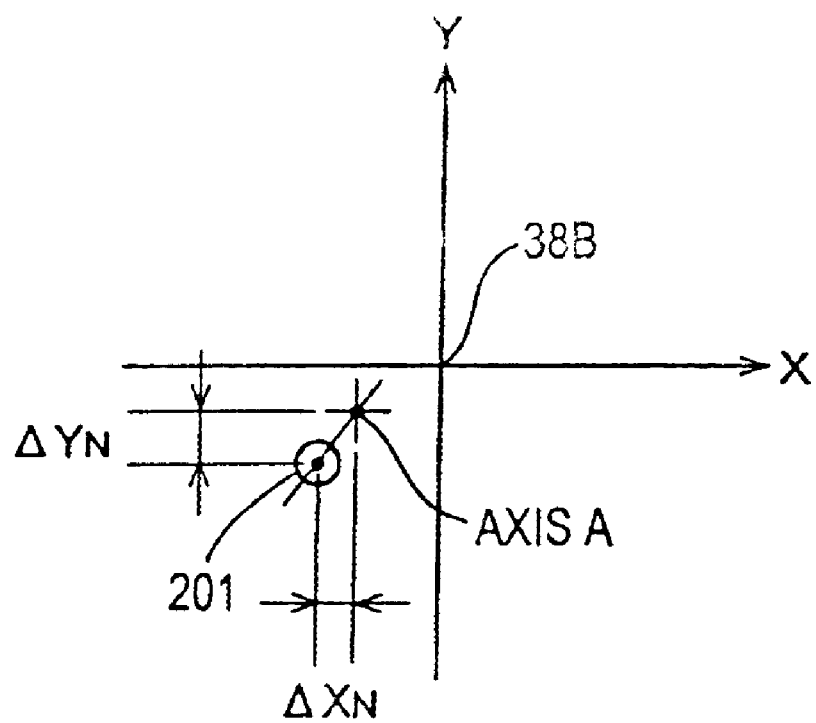
FIG. 11 is a view for explaining a manner of detecting a positioning error of the sucking surface of the suction nozzle.

There will be described the manner of detecting the positioning error of the sucking surface 201 of each suction nozzle 190. If the suction nozzle 190 is eccentric or bent relative to the nozzle body 198, the position of the image of the sucking surface 201 is offset from the rotation axis A of the suction nozzle 190, as indicated in FIG. 11. Error distances $\Delta XN$ and $\Delta YN$ between the image of the sucking surface 201 and the rotation axis A represent an amount and a direction of a positioning error of the sucking surface 201 with respect to the rotation axis A (hereinafter referred to simply as "positioning error of the sucking surface 201" where appropriate). In the present embodiment, the positioning error values $\Delta XN$ and $\Delta YN$ of the sucking surface 201 are obtained on the basis of the image of the sucking surface 201 taken at the component-receiving angular position 130H of the corresponding component-holding head 130, and the rotation axis A of the corresponding suction nozzle 190. This manner of obtaining the positioning error values $\Delta XN$ and $\Delta YN$ is applicable to both the ordinary suction nozzles 190 and the reference suction nozzle 190. The image of the sucking surface 201 used to obtain the positioning error of the sucking surface 201 is taken by one of the two component cameras 350, 352, for instance, by one of the cameras 350, 352 which has a high magnification ratio. The amount and direction of the positioning error of the sucking surface 201 of each suction nozzle 190 are stored in the RAM 406, together with the code data of the corresponding component-holding head 130 and nozzle holder 192.

Where the electronic component 38 is the ordinary electronic component whose predetermined sucking position 38A of the electronic component 38 is aligned with its center position, the component supply table 30, 32 is moved so that the center position of the electronic component 38 to be transferred to the suction head 190 is aligned with the axis of rotation of the component-holding head 130 located at the component receiving position 130A. In the presence of any of the positioning error of the tape feeder 36, the positioning error of the rotation axis of the component-holding head 130 and the positioning error of the sucking surface 201 of the suction nozzle 190 with respect to the rotation axis of the head 130, however, the center position of the ordinary electronic component 38 is offset from the rotation axis of the suction nozzle 190, so that the center position of the electronic component 38 is not aligned with the sucking surface 201. Where the predetermined sucking position 38A of the electronic component 38 is offset from its center position, the sucking position 38A of the electronic component 38 is not aligned with the sucking surface 201. In view of the above aspects, the movement data for the component supply table 30, 32 are prepared and modified on the basis of the predetermined sucking position 38A of the electronic component 38 and the positioning errors described above, so that the electronic component 38 is sucked by the suction nozzle 190 without a misalignment of the sucking surface 201 with respect to the predetermined sucking position 38A of the electronic component 38.

Figure 12A:
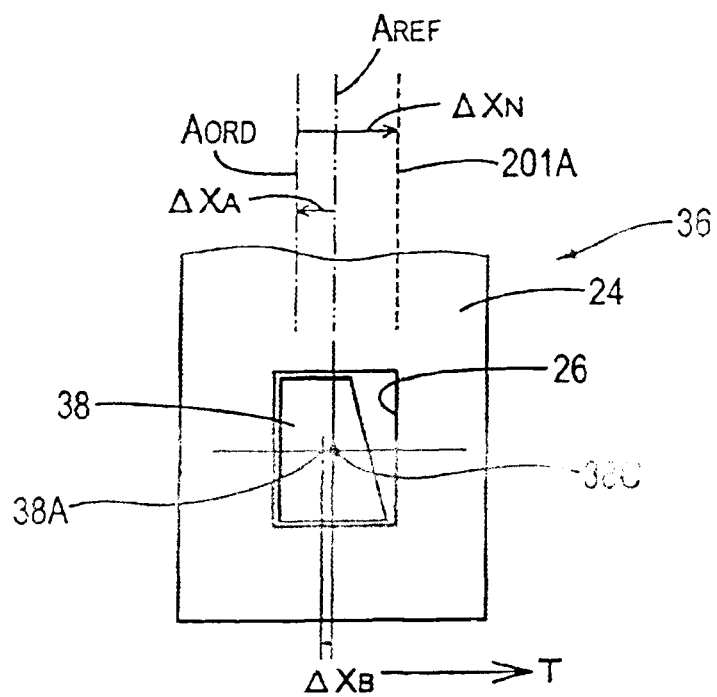
FIGS. 12A and 12B are views for explaining manners of setting and adjusting positioning data of the tape feeder on the basis of the positioning error of the sucking surface.
Figure 12B:
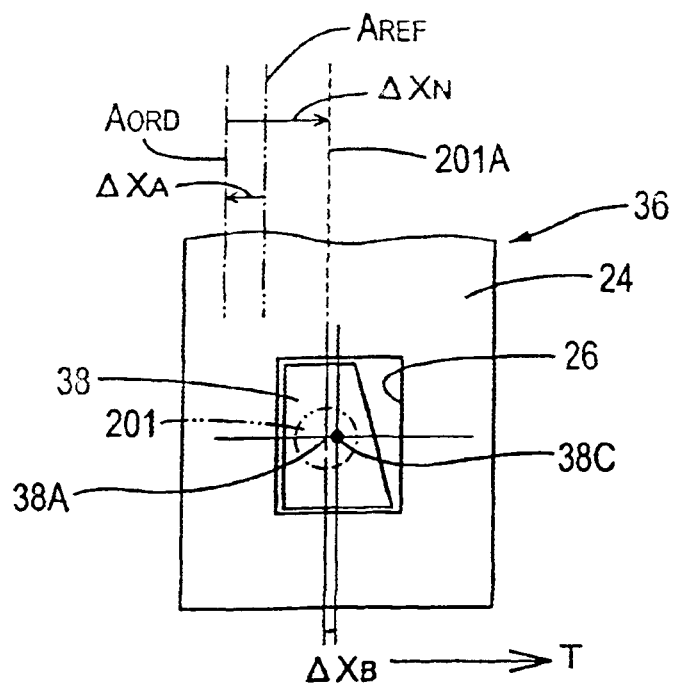
Figure 14:
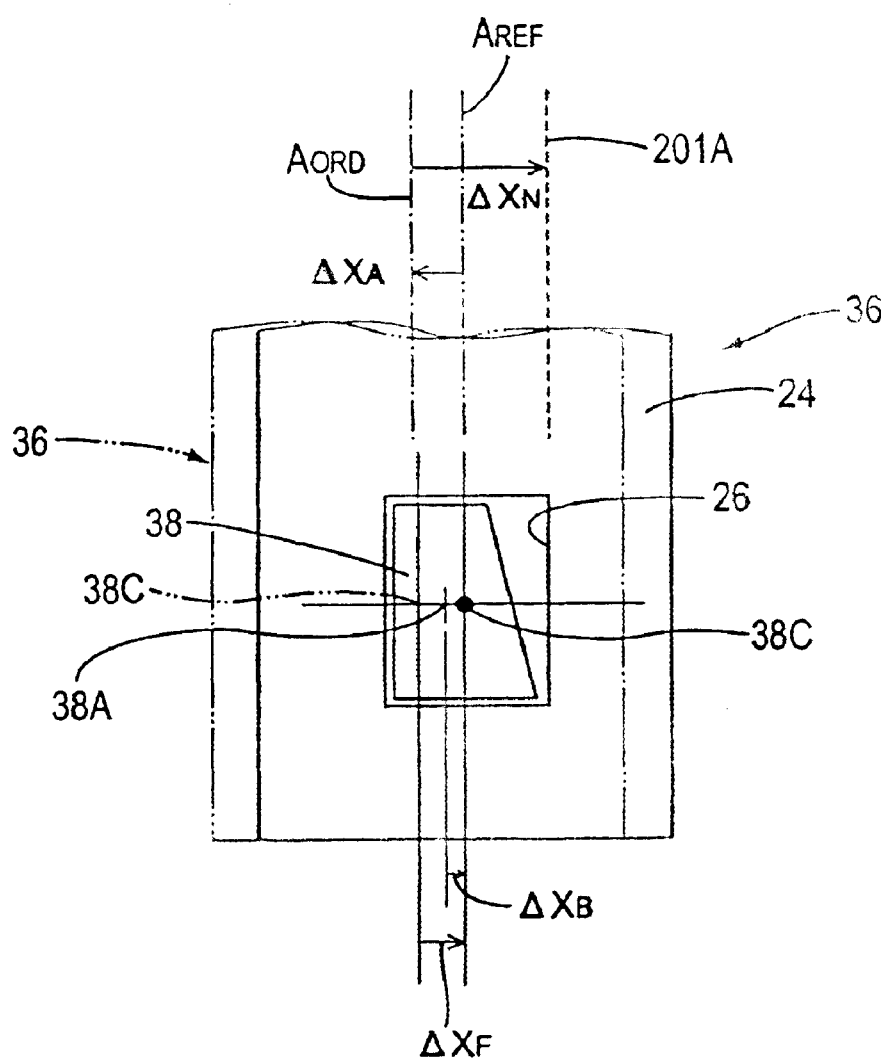
FIG. 14 is a view for explaining a manner of adjusting the positioning data of the tape feeder on the basis of the positioning error of the tape feeder as well as the positioning error of the sucking surface.

The movement data used to move the component supply table 30, 32 are modified on the basis of the X-axis components $\Delta XA$ and $\Delta XN$ of the positioning error values $\Delta XA$ and $\Delta YA$ of the rotation axis A of the suction nozzle 190 and the positioning error values $\Delta XN$ and $\Delta YA$ of the sucking surface 201, which are detected as described above. Since the component supply table 30, 32 is moved in the X-axis direction only, the movement data of the table 30, 32 are adjusted for compensation for only the X-axis components $\Delta XA$ and $\Delta XN$ of those positioning error values $\Delta XA$, $\Delta YA$, $\Delta XN$ and $\Delta YN$ of the positioning error values. The table positioning device 46 is operated according to the thus modified or adjusted movement data, to move the component supply table 30, 32. The X-axis components $\Delta XA$ and $\Delta XN$ of the positioning error values are obtained on the basis of the image of the sucking surface 201 by the component camera 350, 352, and the obtained X-axis components $\Delta XA$ and $\Delta XN$ are adjusted for compensation for the positional difference between the component receiving position 130A and the component hold-position detecting position 130D, and for the reversal in the Y-axis direction of the image of the sucking surface taken by the component camera 350, 352 in the upward direction. In this respect, it is noted that the X-axis components $\Delta XA$ and $\Delta XN$ of the positioning error values as indicated in FIGS. 12A, 12B and 14 are the values after the adjustment for compensation for the positional difference and the image reversal. The rotation axis A of the suction nozzle 190 is detected for each of the two component cameras 350, 352, on the basis of the images of the sucking surface 201 taken by the two component cameras 350, 352. However, the positioning error of the sucking surface 201 used to modify the movement data of the component supply table 30, 32 is detected on the image of the sucking surface 201 taken by one of the two component cameras 350, 352, for instance, by the camera 350, 352 which has the higher magnification ratio. The position of the rotation axis Aord of each ordinary suction nozzle 190 may also be detected on the basis of the image taken by one of the two component cameras 350, 352, for example, by the camera having the higher magnification ratio. The position of the rotation axis Aord of each ordinary suction nozzle is obtained on the basis of the rotation axis Aref of the reference suction nozzle and the positioning error of the rotation axis Aord of the ordinary suction nozzle with respect to the rotation axis Aref of the reference suction nozzle. The positioning error value of the rotation axis Aord of the ordinary suction nozzle obtained on the basis of the image taken by the camera 350 is the same as that obtained on the basis of the image taken by the camera 352.

FIG. 12A indicates an error distance $\Delta XB$ of the sucking position 38A of the electronic component 38 with respect to its center position, an error distance $\Delta XA$ of the rotation axis Aord of the ordinary suction nozzle 190 with respect to that of the reference suction nozzle, and an error distance $\Delta XN$ of the rotation axis Aord of the ordinary suction nozzle with respect to the center 201A of the sucking surface 201. On the basis of these error distances, the movement data of the component supply device 30, 32 are prepared and modified. In FIGS. 12A and 12B, an arrow T indicates the direction of movement of the component supply table 30, 32 when the electronic component 38 is received by the suction nozzle 190, and arrows of the lines representing the error distances are directions in which the component supply table 30, 32 is moved for compensation for the error distances.

The movement data of the component supply tables 30, 32 are prepared such that the predetermined sucking position 38A of the electronic component 38 is aligned with the axis of rotation of the reference suction nozzle, and the thus prepared movement data are modified on the basis of the positioning error values $\Delta XA$ and $\Delta XN$. The movement data for the component supply table 30, 32 are prepared on the basis of the position of the component supply table 30, 32 and the predetermined sucking portion (defined by the offset distance $\Delta XB$) when the center position of the ordinary electronic component 38 is aligned with the rotation axis A of the reference suction nozzle 190 in the X-axis direction while at the same time the widthwise center 38C of the opening 26 is aligned with the rotation axis A of the reference suction nozzle 190. Since the positioning error of the tape feeder 36 is not obtained upon a daily pre-operation inspection of the mounting system 12, the positioning error of the tape feeder 36 is not taken into account when the movement data are prepared. The movement data of the component supply tables 30, 32 are prepared and modified for all the tape feeders 36 from which the electronic components 38 are supplied. Each of the component-holding heads 130 are rotated to their angular zero position (component-receiving angular position 130H) when the heads 130 are located at the angular-head-position resetting position 130G after the electronic components 38 have been mounted on the printed-wiring board 12. Accordingly, each component-holding head 130 receives the electronic component 38 when the head 130 is placed in the predetermined component-receiving angular position 130H. The positioning error of the suction pipe 200 with respect to the tape feeder 36 due to the positioning error of the sucking surface 201 with respect to the rotation axis A of the suction nozzle 190 is the same for each of the component-holding heads 130, for each of the electronic components 38 to be supplied from that tape feeder 36. Further, the individual suction nozzles 190 have respective positioning errors of their rotation axes. The same positioning error is used to modify the movement data of the component supply table 30, 32 for the same suction nozzle 190 which receives the electronic components 38 from the same tape feeder 36. The movement data of the component supply table 30, 32 are modified such that the predetermined sucking position 38A of the electronic component 38 is substantially aligned with the center position of the sucking surface 201 in the X-axis direction, as indicated in FIG. 12B, so that the electronic component 3 can be held by the suction nozzle 190 with high stability, even where the electronic component 38 is comparatively large while the positioning error of the sucking surface 201 is comparatively large. Although FIG. 12B shows that the sucking position 38A of the electronic component 38 is aligned with the center position of the sucking surface 201 in the Y-axis direction, too, they are not actually aligned with each other since the movement data are not modified for compensation for the positioning error in the Y-axis direction. Thus, the movement data for the ordinary suction nozzles 190 are prepared and modified for alignment of the predetermined sucking position 38A of the electric component 38 with the center position of the sucking surface 201. The movement data for the reference suction nozzle 190 are prepared in the same manner as that for the ordinary suction nozzles 190, except that the positioning error value $\Delta XA$ is zeroed, so that the electronic component 38 is sucked by the reference suction nozzle with a reduced amount of error of the sucking position 38A. The movement data for the ordinary electronic component 38 are prepared with the positioning error value $\Delta XB$ being zeroed. Thus, the movement data for the component supply table 30, 32 are prepared depending upon whether the electronic component 38 is the ordinary component having a rectangular shape or a non-ordinary component, and depending upon whether the suction nozzle 190 is the reference suction nozzle or the ordinary suction nozzle.

Figure 13:
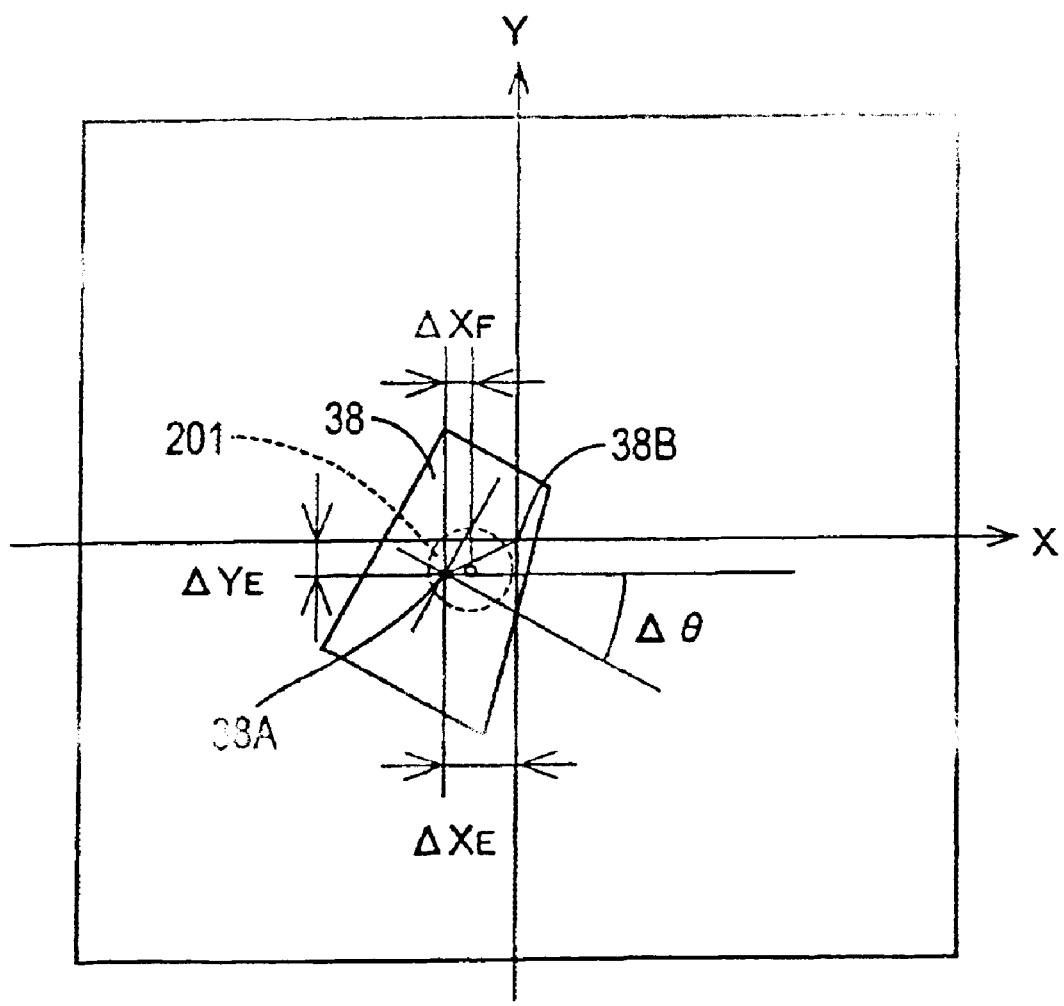
FIG. 13 is a view for explaining a manner of detecting a positioning error of the tape feeder.

There will be described the manner of detecting the positioning error of the tape feeder 36 and the manner of modifying the movement data for compensation for the detected positioning error. In the present embodiment, the positioning error of the tape feeder 36 is detected when the electronic component 38 is mounted on the printed-wiring board 60. Even when the movement data of the component supply table 30, 32 are prepared and modified on the basis of the predetermined sucking position 38A of the electronic component 38 and the positioning errors described above, the electronic component 38 held by the suction nozzle 190 may still have a positioning error in the X-axis direction, namely, the predetermined sucking position 38A of the electronic component 38 may not be aligned with the center position of the sucking surface 201. This misalignment may be caused by a positioning error of the tape feeder 36. The positioning error of the tape feeder 136 in the X-axis direction is obtained on the basis of the horizontal positioning error $\Delta XE$ obtained on the basis of the image of the electronic component 38 held by the suction nozzle 190.

Where the horizontal positioning error $\Delta XE$ of the electronic component 38 is detected, as indicated in FIG. 13, X-axis error of the center position of the sucking surface 201 with respect to the center of the imaging area 38B is subtracted the horizontal positioning error $\Delta XE$, and the thus obtained difference is stored in the RAM 406, as the positioning error of the tape feeder 36 in the X-axis direction, together with data identifying the tape feeder 36 from which the component 38 is supplied. The horizontal positioning errors $\Delta XE$ and $\Delta YE$ are error distances between the predetermined sucking position 38A of the electronic component 38 and the center of the imaging area 38B. If the predetermined sucking position 38A lies on the center of the electronic component 38, the horizontal positioning errors $\Delta XE$ and $\Delta YE$ are error distances between the center of the electronic component 38 and the center of the imaging area 38B. The center position of the sucking surface 201 in the imaging area is obtained on the basis of the positioning error of the sucking surface 201, where the suction nozzle 190 is the reference suction nozzle. Where the suction nozzle 190 is one of the ordinary suction nozzles, the center position of the sucking surface 201 is obtained on the basis of the positioning error of the rotation axis of the ordinary suction nozzle with respect to that of the reference suction nozzle, and the positioning error of the sucking surface 201. Where the angular position of the electronic component 38 is changed, the positioning error of the tape feeder 36 is obtained on the basis of a change of the angular position of the electronic component 38. Namely, a positioning error of the center 201A of the sucking surface 201 with respect to the predetermined sucking position 38A of the electronic component 38 before the suction nozzle 190 is rotated to change the angular position of the electronic component 38 is obtained on the basis of the obtained image data, that is, the predetermined sucking position 38A of the electronic component 38, the center position of the sucking surface 201, the position of the axis of rotation A of the suction nozzle 190 and the angle and direction of rotation of the suction nozzle 190 to change the angular position of the electronic component 38. When a predetermined number of the electronic components 38 have been supplied from the same tape feeder 36, an average of the X-axis positioning error values obtained of those electronic components 38 is calculated, and is used as a positioning error ΔXF of that tape feeder 36 in the X-axis direction. The position error values ΔXF of all the tape feeders 36 are stored in the RAM 406, together with data indicative of the X-axis positions of the tape feeders 36 on the feeder support block 34. Although FIG. 13 shows the electronic component 38 as viewed in the downward direction, for easier understanding, the image of the electronic component 38 is actually formed in the imaging area such that the image is reversed in the Y-axis direction.

The movement data for the component supply table 30, 32 are modified on the basis of the positioning error ΔXF of each tape feeder 36. Where the positioning error ΔXF of the tape feeder 36 is detected, for instance, the movement data are modified for compensation for the positioning error ΔXF of the tape feeder 36 as well as the positioning error ΔXA of the rotation axis of the suction nozzle and other positioning errors, so that the electronic component 38 can be held by the suction nozzle 190 with increased stability. This modification is also affected while taking into account the positional difference between the component-receiving position and the component hold-position detecting position 130D and the Y-axis reversal of the image of the electronic component 38 taken by the component camera 350, 352 in the upward direction.

The detection of the positioning error of the tape feeder 36 and the modification of the movement data of the component supply table 30, 32 are affected during the component mounting operation. The detection and modification may be affected either once during the mounting operation of a selected one of the electronic components 38 supplied form each tape feeder 36, or for all of those electronic components 38. Alternatively, the detection and modification are affected when a predetermined condition is satisfied, for instance, when a predetermined number of the electronic components 38 have been supplied from the relevant tape feeder 36. In this case, the number of the electronic components 38 supplied from the tape feeder 36 is counted during the component mounting operation and compared with the predetermined number. This predetermined number is determined to be larger than the predetermined number used to obtain the positioning error ΔXF indicated above. Where the detection of the positioning error of the tape feeder 36 is affected two or more times, the movement data of the component supply table 30, 32 are updated each time the positioning error is detected.

When the predetermined condition for detecting the positioning error of the tape feeder 36 is satisfied after the initiation of the component mounting operation, for example, when a predetermined time has passed after the initiation of the component mounting operation, the component mounting operation is interrupted, and the positioning error is detected to modify the movement data. In the present embodiment, the positioning error of the rotation axis Aref of the reference suction nozzle and the positioning error of the sucking surface 201 are also detected when the positioning error of the tape feeder 36 is detected. However, the positioning error of the rotation axis A of the ordinary suction nozzle 190 is not detected at this time, but the positioning error of the same detected when the mounting system 12 is not in operation is used to modify the movement data.

The rotation axis Aref of the reference suction nozzle 190 is detected on the basis of the two images of the sucking surface 201 of the reference suction nozzle 190, and the positioning errors of the center points of the imaging areas of the component cameras 350, 352 with respect to the detected rotation axis Aref of the reference suction nozzle 190 are obtained. However, the positions of the component cameras 350, 352 are not actually adjusted during the component mounting operation, but the movement data of the board positioning device 64 are modified for compensation for the obtained positioning errors of the cameras 350, 352. Namely, the obtained positioning errors of the center points of the imaging areas with respect to the rotation axis Aref of the reference suction nozzle 190 are stored in the RAM 406, and the horizontal positioning errors of the electronic component 38 with respect to the rotation axis Aref of the reference suction nozzle are obtained on the basis of the stored positioning errors, so that the movement data of the board positioning device 64 are modified on the basis of the obtained horizontal positioning errors. To detect the center position error of the electronic component 38 due to the angular position adjustment for compensation for the angular positioning errorΔθ, the position of the rotation axis A of the ordinary suction nozzle 190 is obtained on the basis of the positioning error of the center of the imaging area 38B, and the positioning error of the rotation axis A of the ordinary suction nozzle with respect to the rotation axis Aref of the reference suction nozzle. The positioning error of the sucking surface 201 of the reference suction nozzle 190 is detected on the basis of the image of the sucking surface 201 taken when the component-holding head 130 is placed in the angular zero position or component-receiving angular position. The positioning error of the sucking surface 201 of the ordinary suction nozzle 190 with respect to its rotation axis A is detected on the basis of the image of the sucking surface 201 taken when the head 130 is placed in the angular zero position. At this time, too, the position of the rotation axis A of the ordinary suction nozzle 190 is obtained on the basis of the positioning error of the center of the imaging area 38B, and the positioning error of the rotation axis A of the ordinary suction nozzle with respect to the rotation axis Aref of the reference suction nozzle.

When the suction nozzle 190 is changed from one to another, the positioning errors such as the positioning error of the rotation axis A of the component-holding head 130 are detected, and the movement data of the component supply table 30, 32 are modified according to the detected positioning errors. In this case, the position of the rotation axis A of at least the presently selected suction nozzle 190 is detected. However, the positions of the rotation axes of the other suction nozzles 190 may be detected. When the reference suction nozzle 190 is changed to one of the ordinary suction nozzles 190, the positions of the rotation axes of all the suction nozzles 190 including the new reference suction nozzle are detected, and the positioning errors of the rotation axes of the ordinary suction nozzles with respect to the rotation axis A of the reference suction nozzle are detected. In this case, the actual positions of the component cameras 350, 352 are not adjusted, but the movement data of the board positioning device 64 are modified for compensation for the positioning errors of the center positions of the imaging areas of the cameras 350, 352.

It will be understood from the foregoing description of the present embodiment that a relative-position obtaining portion operable to obtain a relative position between the sucking surface 201 of the suction nozzle 190 and the rotation axis of the component-holding head 130 placed in a predetermined angular position is constituted by a portion of the control device 400 assigned to rotate the component-holding head 130 to two imaging angular positions, operate the component cameras 350, 352 to take images of the sucking surface 201 at the two imaging angular positions, and detect the positioning error of the sucking surface 201 with respect to the rotation axis of the head 130 in the component-receiving angular position. It will also be understood that a relative-movement control portion operable to control the table positioning devices 46 for moving the component-holding head 130 and the component supply device 14 relative to each other is constituted by a portion of the control device 400 assigned to prepare and modify the movement data of the component supply tables 30, 32 on the basis of the predetermined sucking position 38A of the electronic component 38, the detected positioning error of the sucking surface 201, the detected positioning error of the rotation axis of the head 130 and the detected positioning error of the tape feeder 36, and to control the table positioning devices 46 according to the modified movement data, for moving the component supply tables 30, 32. It will further be understood that a component-transfer control portion operable to move the component-holding head 130 and the component supply device 14 toward each other, for transferring the electronic component 38 from the component supply device 14 to the suction nozzle 190 is constituted by a portion of the control device 400 assigned to rotate the component-holding head 130 to the angular zero position and operate the head lifting and lowering device 230 for lowering the component-holding head 130 toward the component supply device 14, for the suction nozzle 190 to receive the electronic component 38.

The component mounting operation may be interrupted to detect the position of the rotation axis A of the ordinary suction nozzle 190 and obtain the positioning error of the rotation axis A of the ordinary suction nozzle with respect to the rotation axis A of the reference suction nozzle. In this case, the component-holding head 130 is rotated to the two imaging angular positions, for taking the two images of the sucking surface 201 when the head 130 is placed in the respective two imaging angular positions.

While each component-holding head 130 in the first embodiment is turned by the turning device 132 about the vertical axis, a component-holding head may be moved by a suitable XY positioning device in mutually perpendicular X-axis and Y-axis directions in an XY plane parallel to the surface of the printed-wiring board. An electronic-component mounting system having such component-holding head and XY positioning device according to a second embodiment of this invention will be briefly described by reference to FIGS. 15–18. An example of this type of electronic-component mounting system is disclosed in JP-B2-2824378.

Figure 15:
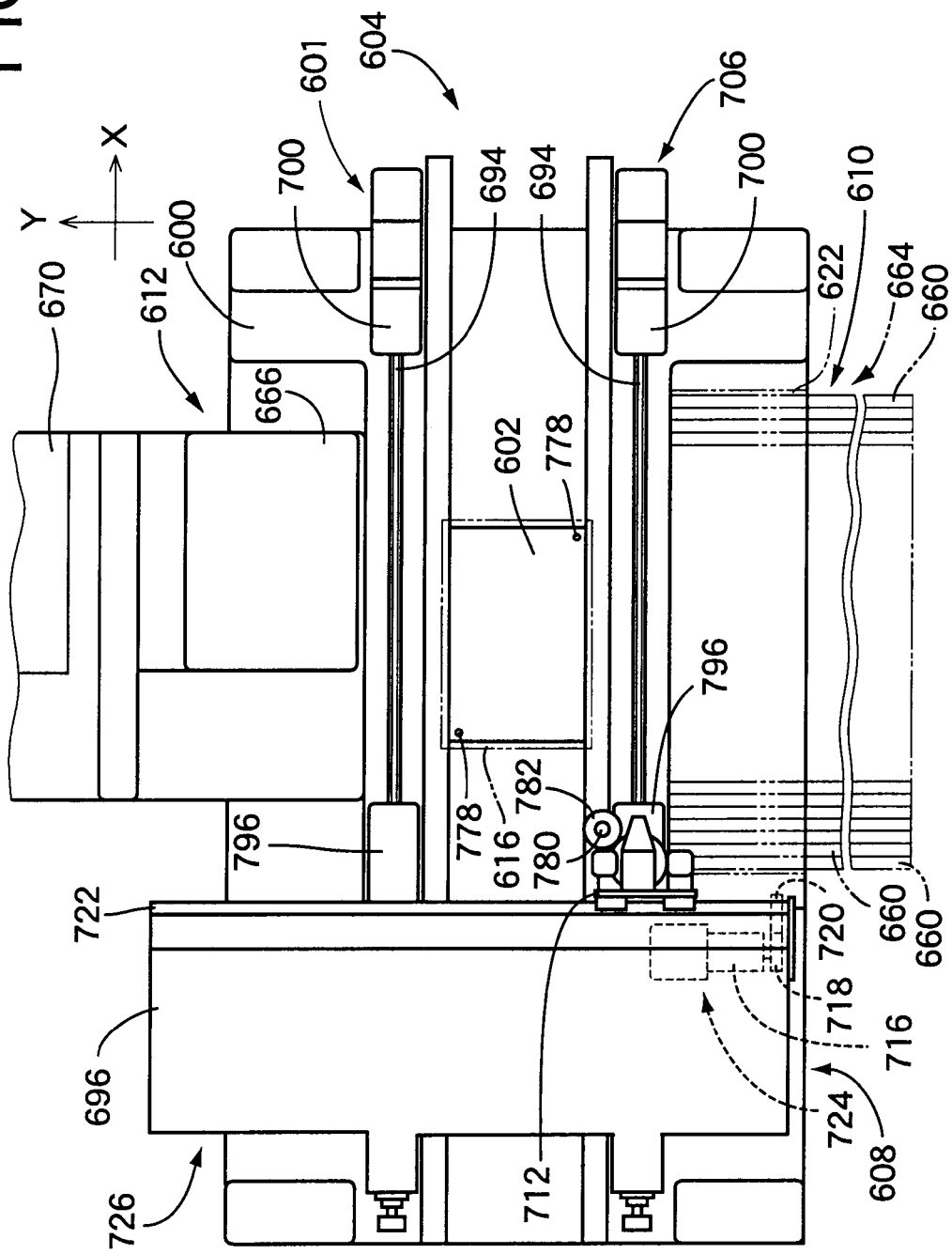
FIG. 15 is a plan view showing an electronic-component mounting system constructed according to another embodiment of this invention.

Referring first to FIG. 15, reference numeral 600 denotes a machine base of an electronic-component mounting system 601. The electronic-component mounting system includes a printed-wiring board conveyor (PWB conveyor) 604, a component mounting device 608, component supply devices 610, 612, and a printed-wiring board support device (PWB support device) 616, which are mounted on the machine base 600. The PWB conveyor 604 is arranged to transfer a circuit substrate in the form of a printed-wiring board 602 in an X-axis direction (in the left and right directions as seen in FIG. 15). The component mounting device 608 is arranged to mount electric components in the form of electronic components 606 (FIG. 18) on the printed-wiring board 602. The component supply devices 610, 612 are arranged to supply the component mounting device 608 with the electronic components 506. The PWB support device 616, which serves as a circuit-substrate support device, is arranged to support the printed-wiring board 602.

Figure 18:
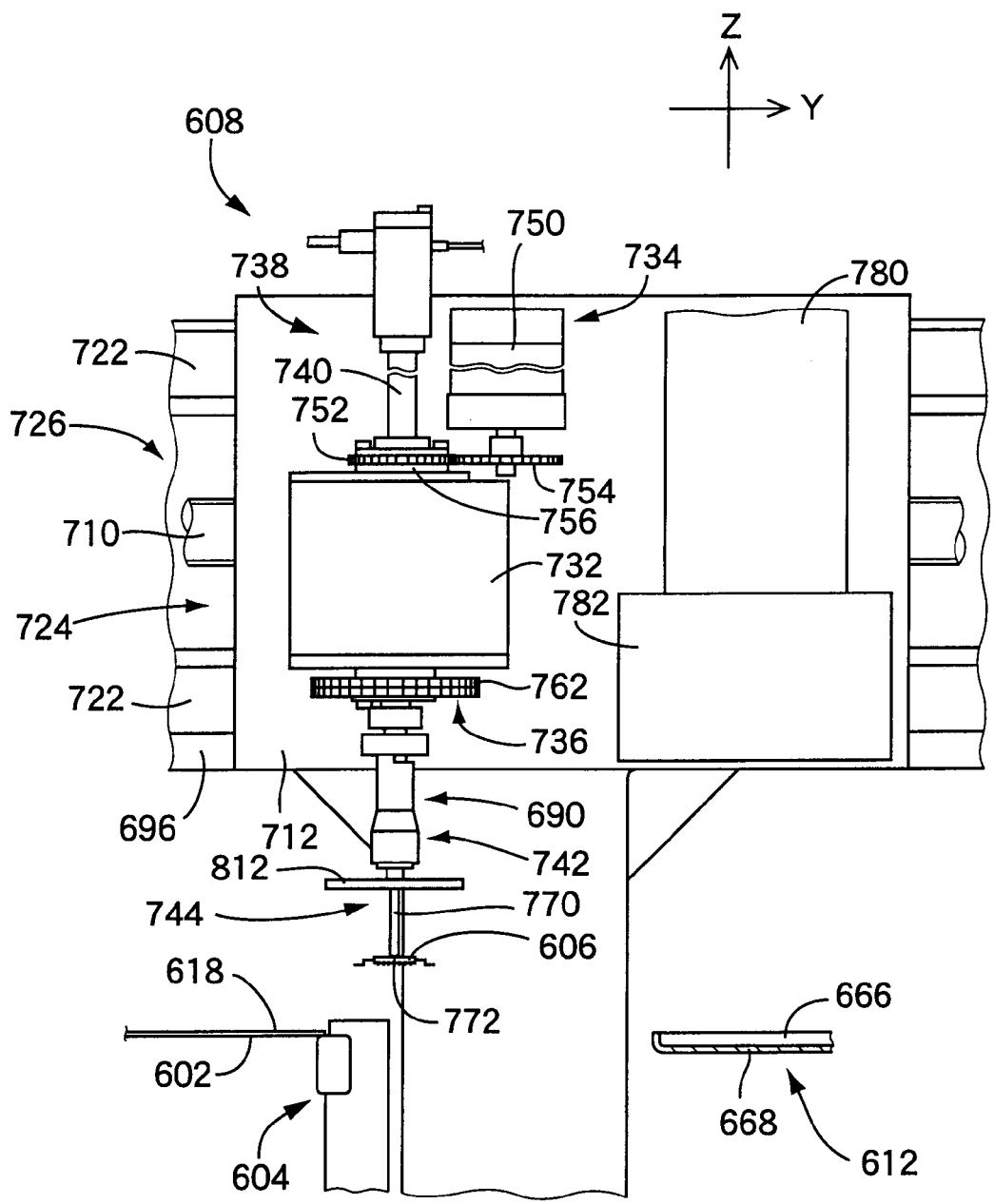
FIG. 18 is a side elevational view (partly in cross section) of a component mounting device of the electronic-component mounting system of FIG. 16.

In the present second embodiment, the printed-wiring board 602 is transferred by the PWB conveyor 604 such that the printed-wiring board 602 maintains a horizontal attitude or posture. The PWB conveyor 604 is stopped by a suitable stopper device (not shown), to locate the board 602 at a predetermined component-mounting position. The board 602 located at the component-mounting position is supported by the PWB support device 616. In the present electronic-component mounting system 601, the printed-wiring board 602 is supported such that a component-mounting surface 618 of the board 602 on which the electronic components 606 are mounted is parallel to the horizontal plane, as indicated in FIG. 18.

In the present embodiment, too, movement data for moving and positioning a component-holding head 690 (which will be described) of the component mounting device 608 are defined in an XY coordinate system in which the electronic component 606 is seen in the downward direction (Z-axis direction) and in which the above-indicated X-axis direction and a Y-axis direction are respectively parallel to the horizontal and vertical directions as seen in the plan view of FIG. 15 wherein the component supply device 612 is located above the component supply device 610. The upward and rightward directions in FIG. 15 are positive X-axis and Y-axis directions, respectively.

Figure 16:
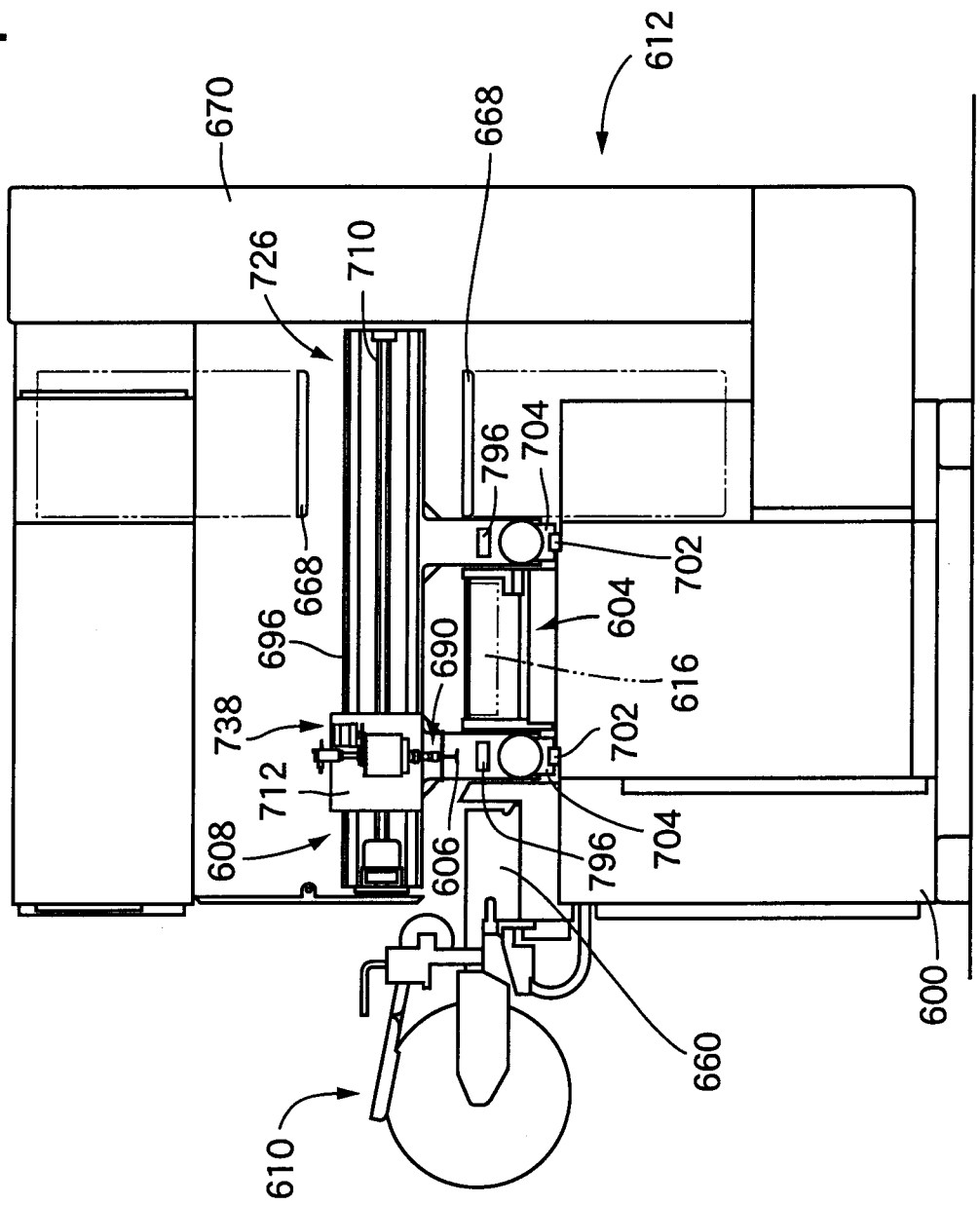
FIG. 16 is a side elevational view of the electronic-component mounting system of FIG. 15.

The component supply devices 610, 612 are spaced from each other in the Y-axis direction of the XY coordinate system, and located on the opposite sides of the PWB conveyor 604, as shown in FIGS. 15 and 16. In the present embodiment, the component supply device 610 is of tape feeder type, while the component supply device 612 is of tray type.

The component supply device 610 of tape feeder type includes a component supply table 664 on which a multiplicity tape feeders 660 are mounted such that the component-supply portions of the tape feeders 660 are arranged in a straight line parallel to the X-axis direction. Like the tape feeder 36 described above, each tape feeder 660 has a tape cartridge arranged to feed a carrier tape which accommodates the electronic components 606.

The component supply device 612 of tray type includes a multiplicity of component trays 666 (FIG. 18) each accommodating a multiplicity of electronic components 606. The component trays 666 are accommodated in respective multiple tray boxes 668, which are vertically arranged and are supported by respective support members. The tray boxes 668 are elevated one after another by an elevator device disposed within a column 670 (FIG. 15), to a predetermined component-supply position. For the component-holding head 690 (which will be described) of the component mounting device 608 to receive the electronic components 606 from the component tray 666 in the tray box 668 located at the component-supply position, some vertical space must be provided above the component-supply position. To provide this vertical space, the tray box 668 from which the electronic components 606 have been transferred to the component-holding head 690 is moved further upwards from the component-supply position to a predetermined retracted position when the next tray box 668 is moved to the component-supply position, so that the required vertical space is provided between the component-supply position and the retracted position. The component supply device 612 of tray type is identical in construction to a component supply device disclosed in JP-B2-2-57719.

Figure 17:
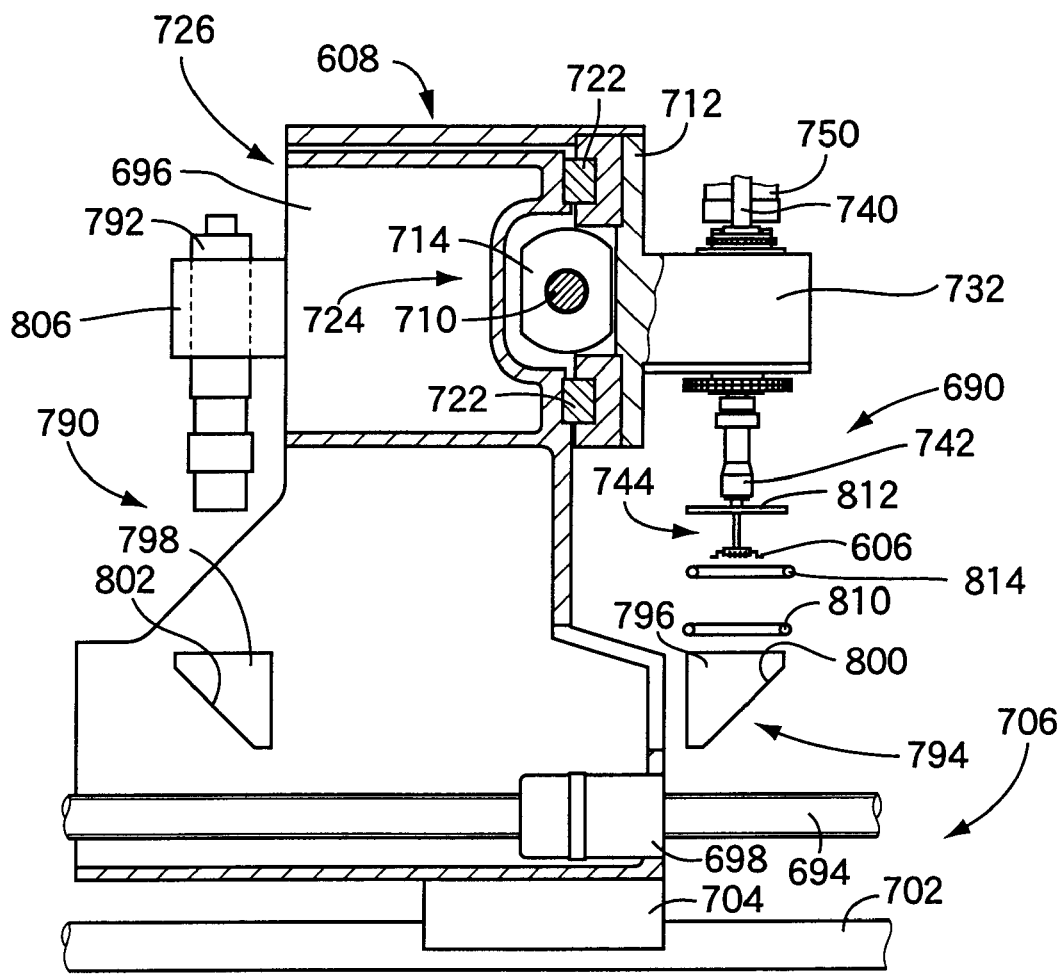
FIG. 17 is a front elevational view (partly in cross section) of the electronic-component mounting system of FIG. 15.

The component-holding head 690 of the component mounting device 608 is movable in the mutually perpendicular X-axis and Y-axis directions, so that the component-holding head 690 can take a linear movement having X-axis and Y-axis components, to move each electronic component 606 to a desired position on or above the component-mounting surface 618 of the printed-wiring board 602. To move the component-holding head 690 in the X-axis direction, the component mounting device 608 includes two ballscrews 694 disposed on the machine base 600, on the opposite sides of the PWB conveyor 604, so as to extend in the X-axis direction, as sown in FIG. 15, and an X-axis slide 696 having two ballnuts 698 (only one of which is shown in FIG. 17) which engage the respective ballscrews 694. The device 608 further includes two X-axis drive motors 700 for rotating the ballscrews 694, for moving the X-axis slide 696 in the X-axis direction.

As shown in FIG. 18, the X-axis slide 696 extends in the Y-axis direction across the PWB conveyor 604, and has a length corresponding to the distance between the component supply device 610 of feeder type and the component supply device 612 of tray type. On the machine base 600, there are disposed two guide rails 702 (FIG. 17) located under the respective ballscrews 694. The X-axis slide 696 has two guide blocks 704 which slidably engage the guide rails 702, for guiding the X-axis slide 696 in the X-axis direction. It will be understood that the ballscrews 694, ballnuts 698 and X-axis drive motors 700 cooperate with each other to constitute an X-axis drive device 706.

On the X-axis slide 696, there is disposed a ballscrew 710 so as to extend in the Y-axis direction, as shown in FIG. 17. The X-axis slide 696 carries a Y-axis slide 712 having a ballnut 714 which engages the ballscrew 710. The ballscrew 710 is rotated by a Y-axis drive motor 716 (FIG. 15) through gears 718, 720, so that the Y-axis slide 712 is moved in the Y-axis direction while being guided by a pair of guide rails 722 (FIG. 17). It will be understood that the ballscrew 710, ballnut 714 and Y-axis drive motor 716 constitute a Y-axis drive device 724, and that the Y-axis drive device 724 cooperates with the X-axis slide 696, X-axis drive device 706 and Y-axis slide 712, to constitute an XY positioning device 726 for moving the component-holding head 690 to a desired position in the XY plane.

The Y-axis slide 712 has a support portion 732 on which there are mounted the above-indicated component-holding head 690, a Z-axis drive device 734 for moving up and down the component-holding head 690 in a Z-axis direction, and a rotary drive device 736 for rotating the component-holding head 690 about its axis. The component-holding head 690, the Z-axis drive device 734 and the rotary drive device 736 constitute a component mounting unit 738. Although the component mounting device 738 in the present electronic-component mounting system includes only one component mounting unit, the electronic-component mounting system may include a plurality of component mounting units. For instance, the two or more component mounting units are disposed on the Y-axis slide 712 such that the units are arranged in a row in the Y-axis direction.

The component mounting unit in the present embodiment is identical with a component mounting unit as disclosed in JP-B2-4-3093339. The component mounting unit will be described only briefly.

The support portion 732 supports a shaft 740 such that the shaft 740 is axially movable in the Z-axis direction and rotatable about its axis. The shaft 740 carries a nozzle holder 742 at its lower end. A suction nozzle 744 is removably held by the nozzle holder. In the present embodiment, the shaft 740 and the nozzle holder 742 cooperate to constitute the component-holding head 690.

The Z-axis drive device 734 includes a drive source in the form of a Z-axis drive motor 750, and a rotary motion of the Z-axis drive motor 750 is transmitted to a ballnut 756 through a rotary motion transmitting device including gears 752, 754. With a rotary motion of the ballnut 756, the shaft 740 engaging the ballnut 756 is moved in the Z-axis direction to lift and lower the component-holding head 690. The Z-axis drive device 734 functions as a device operable to move the component-holding head 690 toward and away from the printed-wiring board 602. The rotary drive device 736 includes a drive source in the form of a nozzle rotation motor 760 (FIG. 19), and a rotary motion of the nozzle rotation motor 760 is transmitted to the shaft 740 through a rotary motion transmitting device including a gear 762. With a rotary motion of the shaft 740 about its axis, the component-holding head 690 is rotated about its vertically extending axis.

The suction nozzle 744 is arranged to hold each electronic component 606 by suction under a negative pressure, and mount the electronic component 606 on the printed-wiring board 602. To this end, the suction nozzle 744 is connected through a solenoid-operated directional control valve device (not shown) to a negative pressure source, a positive pressure source and the atmosphere. With a switching operation of the directional control valve device, the suction nozzle 744 is selectively communicated with one of the negative and positive pressure sources and the atmosphere. The suction nozzle 744 has a sucking surface 772 which faces downwards and at which the electronic component 606 is sucked by suction.

The Y-axis slide 712 further carries a stationary image-taking device in the form of a fiducial mark camera 780 (FIGS. 15 and 18) operable to take an image of a fiducial mark 778 provided on the printed-wiring board 602, as shown in FIG. 15. In the present embodiment, the fiducial mark camera 780 is a CCD camera adapted to take a two-dimensional image at one time. An illuminating device 782 is provided to illuminate the fiducial mark 778 and its vicinity, when the image of the fiducial mark 778 is taken by the fiducial mark camera 780.

On the X-axis slide 696, there are fixedly disposed two image-taking devices 790 at respective two Y-axis positions corresponding to the respective two ballscrews 694 provided to move the X-axis slide 696. One of the two image-taking devices 790 is located between the component supply device 610 of tape feeder type and the printed-wiring board 602, while the other image-taking device 790 is located between the component supply device 612 of tray type and the board 602. The two image-taking devices 790 are identical in construction with each other.

Each image-taking device 790 includes a component camera 792 for taking an image of the electronic component 606, and a waveguide device 794. The waveguide device 794 includes a reflecting device in the form of reflecting mirrors 796, 798, which are attached through respective brackets to the underside of the X-axis slide 696. The reflecting mirror 796 is disposed at a position within a path of movement of the component-holding head 690 in the Y-axis direction, and has a reflecting surface 800 which is inclined about 45° with respect to a vertical plane including the centerline of the suction nozzle 744, such that one of the opposite ends of the reflecting surface 800 (as viewed in the X-axis direction) which is closer to the X-axis slide 696 is the lower end, that is, the left end of the reflecting surface 800 is the lower end.

The other reflecting mirror 798 is disposed on the side of the X-axis slide 696 which is remote from the reflecting mirror 796 and has a reflecting surface 802 which is inclined with respect to the vertical plane, symmetrically with the reflecting mirror 800. The component camera 792 for taking the image of the electronic component 606 held by the suction nozzle 744 is located on the side of the X-axis slide 696 remote from the component-holding head 690, such that the component camera 792 faces downwards toward the reflecting surface 802 of the reflecting mirror 798.

In this arrangement, the image of the electronic component 606 held by the suction nozzle 744 can be taken by the component camera 792 when the component-holding head 690 is moved by the XY positioning device 726 to the Y-axis position of the corresponding ballscrew 694 at which the electronic component 606 is located right above the reflecting mirror 800 and at which a visible light reflected by a light emitting plate 812 (which will be described) is reflected by the reflecting mirrors 796, 798 and is incident upon the component camera 792. Thus, the image-taking device 790 is arranged to image the electronic component 606 located at the predetermined image-taking position which lies within a path of movement of the electronic component 606 when the Y-axis slide 712 is moved in the Y-axis direction relative to the X-axis slide 696. In the present embodiment, the component camera 792 is a two-dimensional CCD camera, like the fiducial mark camera 780 described above. The reflecting mirror 798 may be eliminated. In this case, the component camera 250 is disposed so as to have a horizontal attitude and face toward the reflecting mirror 796.

A strobe light 810 as a UL irradiating device is disposed near the reflecting mirror 796, for irradiating the light emitting plate 812 of the suction nozzle 744 with a ultraviolet radiation. The light emitting plate 812 absorbs the ultraviolet radiation, and emits the visible light for illuminating the bottom surface of the electronic component 606 held by the suction nozzle 744. In the present embodiment, the light emitting plate 812 and the stroke light 810 provided as the UV irradiating device cooperate to constitute an illuminating device for the image-taking device 790.

Another strobe light 814 for emitting a visible light is disposed nearer to the suction nozzle 744 than the above-indicated strobe light 810. This strobe light 814 serves as an illuminating device for illuminating the bottom surface of the electronic component 606, for taking a normal image of the electronic component 82 rather than a silhouette image. The bottom surface of the electronic component 606 is the surface at which the electronic component 606 is mounted on the printed-wiring board 602. The image-taking devices 790 and the illuminating devices constitute an imaging system.

The present electronic-component mounting system 601 is provided with control means in the form of a control device 830 as shown in FIG. 19. Like the control device 400 used in the first embodiment, the control device 830 is principally constituted by a computer 832. The same reference signs as used in FIG. 8 are used in FIG. 19 to identify the functionally corresponding elements of the control device 830, and redundant description of these elements will not be provided. In the present second embodiment, too, the X-axis drive motors 700 and other drive sources are servomotors, and operating amounts of these servomotors are detected by respective encoders, the output signals of which are fed to the computer 832. In FIG. 19, an encoder 836 provided for the nozzle rotation motor 760 is shown by way of example. The RAM 406 is used to store various control programs down-loaded from a host computer. The control programs include a control program for executing a main control routine, a component-mounting control program, a control program for detecting the axis of rotation of the component-holding head 690, and a control program for detecting the positioning error of the sucking surface 772 of the suction nozzle 744. The RAM 406 also stores data necessary to execute the control programs.

An operation of the present electronic-component mounting system 601 will then be described. The operation to mount the electronic component 606 on the printed-wiring board 602 is described in JP-B2-2824378 and Japanese Patent Application No. 2000-343641 (not laid open at the time the present invention was made). The operation of the system 601 in general will be only briefly described, and those aspects of the operation which relate to the present invention will be described in detail.

When the electronic component 606 is mounted on the printed-wiring board 602, the component-holding head 690 is moved by the X-axis slide 696 and the Y-axis slide 712, to the component supply position at the component supply device 610 of tape feeder type or the component supply device 612 of tray type. The component-holding head 690 is vertically moved by the Z-axis drive device 734, so that the suction nozzle 744 holds the electronic component 606 by suction under a negative pressure. At this time, the component-holding head 690 is placed in its predetermined component-receiving angular position for receiving the electronic component 606. In the present embodiment, the component-receiving angular position of the component-holding head 690 is detected on the basis of the output signal of the encoder 836 provided to detect the operating amount of the nozzle rotation motor 760. Each time the component-holding head 690 receives the electronic component 606, the head 690 is rotated by the nozzle rotation motor 760 to its predetermined component-receiving angular position. There will be described an operation to be performed when the component-holding head 690 receives the electronic component 606 from one of the tape feeders 660 of the component supply device 610 of tape feeder type, by way of example.

The component-holding head 690 is moved from the component supply position at the tape feeder 660, more particularly, from a predetermined component-receiving position at which the electronic component 606 is received from the tape feeder 660, to the predetermined component-mounting position at which the electronic component 606 is mounted on the printed-wiring board 602. At this time, the component-holding head 690 holding the electronic component 606 passes a position right above the reflecting mirror 796 of one of the two image-taking devices 790, which reflecting mirror 796 is fixedly disposed at a position on the X-axis slide 696 between the component-receiving position at the tape feeder 660 and the component-mounting position. Described more specifically, when the component-holding head 690 is moved from the component supply position to the component-mounting position, the Y-axis slide 712 is necessarily moved on the X-axis slide 696 between the component supply device 610 of tape feeder type and the printed-wiring board 602, so that the component-holding head 690 necessarily moves in the Y-axis direction, passing the Y-axis position at which the reflecting mirror 796 is disposed between the component supply position and the component-mounting position, irrespective of the X-axis positions of the component supply position at the component supply device 610 and the component-mounting position on the printed-wiring board 602. Accordingly, an image of the electronic component 606 held by the component-holding head 690 can be taken by the component camera 792. The position at which the component-holding head 690 is located right above the reflecting mirror 796 and at which the image of the electronic component 606 is taken by the component camera 792 is referred to as "component-attitude detecting position" or "component imaging position".

Where the component-receiving angular position of the electronic component 606 when the suction nozzle 744 receives from the component supply device 710 is different from the component-mounting angular position when the electronic component 606 is transferred from the suction nozzle 744 onto the printed-wiring board 602, the component-holding head 690 is rotated by the rotary drive device 736 to rotate the electronic component 606 for thereby establishing the component-mounting angular position while the head 690 is moved from the component-receiving position to the component-attitude detecting position.

When the component-holding head 690 reaches the component-attitude detecting position, the image of the electronic component 606 is taken. Since the strobe lights 810, 814 of the imaging system 790 are disposed on the X-axis slide 696, the image of the electronic component 606 is taken with the component-holding head 690 held at a Y-axis position corresponding to the component-attitude detecting position, while the head 690 is moving in the X-axis direction toward the component-mounting position. Image data representative of the image of the electronic component 606 are compared with stored image data representative of an image of the electronic component 606 having a nominal XY position and a nominal component-mounting angular position, to calculate XY positioning errors $\Delta XE$ and $\Delta YE$ and an angular positioning error $\Delta\theta$.

On the other hand, an image of the fiducial mark 778 provided on the printed-wiring board 602 is taken by the fiducial mark camera 780, to calculate XY positioning errors $\Delta XP$ and $\Delta YP$ of the printed-wiring board 602. While the component-holding head 690 is in the process of movement to the component-mounting position, the movement data of the component-holding head 690 used to move the electronic component 606 to the component-mounting position are compensated for the error of the predetermined sucking position of the electronic component 606 due to the XY positioning errors $\Delta XE$, $\Delta YE$, $\Delta XP$, $\Delta YP$ of the electronic component 606 and board 602 and due to the adjustment for compensation for the angular positioning error $\Delta\theta$ of the electronic component 606. Further, the component-holding head 690 is rotated by the rotary drive device 736 for compensation for the angular positioning error $\Delta\theta$ of the electronic component 606, so that the electronic component 606 can be mounted at the predetermined component-mounting position on the printed-wiring board 602, with the predetermined attitude, that is, in the predetermined component-mounting angular position. The component-holding head 690 is moved to the predetermined component-mounting position, and rotated as needed, with concurrent calculation of the XY positioning errors $\Delta XE$, $\Delta YE$, $\Delta XP$, $\Delta YP$ and angular positioning error $\Delta\theta$, and is lowered onto the printed-wiring board 602 to mount the electronic component 606 on the board 602. Thus, one cycle of component mounting operation is terminated.

In the present embodiment, the XY movement data for moving the component-holding head 690 are defined in the XY coordinate system established for the electronic-component mounting system 601, and the compensation of the XY movement data for compensation for the XY positioning errors $\Delta XE$, $\Delta YE$, $\Delta XP$, $\Delta YP$ and the adjustment of the angular position of the component-holding head 690 for compensation for the angular positioning error $\Delta\theta$ are affected while taking into account the reversal of the image of the electronic component 606 taken by the component camera 792 in the upward direction, for instance, the reversal of the image in the Y-axis direction, as in the first embodiment.

The present electronic-component mounting system 601 has a predetermined component-sucking position on which the XY movement data of the component-holding head 690 are prepared. In the present embodiment, the zero point of the XY positioning device 726 is set with respect to the position of the axis of rotation of the component-holding head 690. To this end, the position of the rotation axis of the head 690 is detected to detect a positioning error of the sucking surface 772, a positioning error of the component camera 792 and a positioning error of the tape feeder 660, and the XY movement data of the head 690 are compensated for the detected positioning errors.

The position of the rotation axis of the component-holding head 690 is detected in the same manner as that of the suction nozzle 190 in the first embodiment. That is, two images of the sucking surface 772 of the suction nozzle 744 placed in respective two angular positions are taken by the component camera 792 when the component-holding head 690 is located at the component-attitude detecting position. The images of the sucking surface 772 are taken in the axial direction of the head 690 toward the sucking surface 772. The position (as represented by the XY coordinate values) of the rotation axis of the head 690 is obtained on the basis of image data representative of the two images of the sucking surface 772 in the respective two angular positions, which consist of a predetermined component-receiving angular position to be established when the electronic component 606 is sucked by the sucking surface 772, and another angular position which is spaced 180° from the component-receiving angular position in the circumferential direction of the head 690. The XY positioning error of the sucking surface 772 is detected on the basis of the image data representative of the image taken at the component-receiving angular position.

The XY positions and angular positions of the component cameras 792 of the two image-taking devices 790 can be adjusted by a position adjusting device (not shown), for compensation for XY positioning errors and angular positioning errors. The imaging area of each component camera 792 is defined by the X and Y axes of the XY coordinate system set for the electronic-component mounting system 601. The XY positioning errors of the component camera 792 are deviations of the actual position of the component camera 792 from the nominal position in the X-axis and Y-axis directions. After the position of the rotation axis of the component-holding head 690 is detected on the basis of the images of the sucking surface 772, the XY positioning errors of the center of the imaging area 38B of the component camera 792 with respect to the rotation axis of the head 690 are detected to adjust the position of the component camera 792 in the X-axis and Y-axis directions for compensation for the XY positioning errors. To adjust the angular position of the component camera 792 for compensation for the angular positioning error, an adjusting jig having mutually perpendicular two reference side surfaces is mounted on the component-holding head 690, in place of the suction nozzle 744, such that the side surfaces are parallel to the rotation axis of the head 690 and such that the adjusting jig is rotatable about its axis relative to the head 690. The adjusting jig is rotated about its axis to an angular position in which the two side surfaces of the adjusting jig are parallel to the X-axis and Y-axis directions, respectively. To confirm the parallelism of the side surfaces to the X-axis and Y-axis directions, a dial indicator is fixed on a suitable stationary member such that the plunger of the dial indicator is held in contact with one of the two side surfaces of the adjusting jig. The parallelism can be confirmed by reading the dial indicator while the head 690 is moved in the X-axis or Y-axis direction by the XY positioning device 726. If the reading of the dial indicator whose plunger is held in contact with one of the two side surfaces remains constant when the head 690 is moved in the Y-axis direction, for instance, this means that the above-indicated one side surface is parallel to the Y-axis direction. The dial indicator may be removably fixed on the PWB support device 616. After the angular position of the adjusting jig is adjusted such that the two side surfaces of the adjusting jig are parallel to the respective X-axis and Y-axis directions, an image of the adjusting jig is taken by the component camera 792, and the angular position of the component camera 792 is adjusted on the basis of image data representative of the image of the adjusting jig. The adjustment of the angular position of the component camera 792 is made while the mounting system 609 is not in the component mounting operation, as in the first embodiment.

In the present embodiment, the component mounting device 608 has only one suction nozzle 744, and the axis of rotation of the suction nozzle 744 is the same as the axis of rotation of the component-holding head 690, namely, there is not an error of the rotation axis of the head 690, so that the XY movement data of the head 690 are adjusted for compensation for the positioning error of the sucking surface 772. Further, the XY positioning error of the tape feeder 660 is detected after initiation of the component mounting operation, on the basis of the XY positioning error of the electronic component 606, and the XY movement data are adjusted for compensation for the XY positioning error of the tape feeder 660. The positioning error of the rotation axis of the head 690, if any, is eliminated by adjusting the XY movement data for compensation for the positioning error of the tape feeder 660. These adjustments are also made while taking into account the reversal of the images taken by the component camera 792 in the upward direction.

In the present embodiment, the component supply devices 610, 612 are stationary while the component-holding head 690 is movable in the X-axis and Y-axis directions by the XY positioning device 726. Accordingly, the positioning errors in the X-axis and Y-axis directions can be eliminated by adjusting the XY movement data of the component-holding head 690. Therefore, the sucking position of the electronic component 606 is set in both of the X-axis and Y-axis directions, and the positioning errors of the sucking surface 772 and the tape feeder 660 are obtained in the X-axis and Y-axis directions. The XY movement data of the head 690 are prepared and adjusted in the X-axis and Y-axis directions so that the center 201A of the sucking surface 772 is aligned with the predetermined sucking position 38A of the electronic component 38, whereby the electronic component 38 can be sucked at its predetermined sucking position 38A of the sucking surface 772.

When a predetermined detecting condition is satisfied after the component mounting operation is initiated, the position of the rotation axis of the head 690 and the positioning errors of the sucking surface 772 are detected. Two images of the sucking surface 772 are taken by the component camera 792 with the head 690 placed in respective two angular positions, in the same manner as used to take the two images before the component mounting operation, and the rotation axis of the head 690 is detected on the basis of the two images, and the positioning errors of the sucking surface 772 with respect to the rotation axis are detected to adjust the XY movement data. During the component mounting operation, the XY and angular positions of the component camera 792 are not adjusted, but the center position error of the imaging area of the component camera 792 with respect to the rotation axis of the head 690 is adjusted by calculation. Described in detail, the position of the rotation axis of the head 690 is obtained on the basis of the center position error of the imaging area with respect to the rotation axis of the head 690, and the XY positioning error of the electronic component 606 with respect to the obtained position of the rotation axis is detected. Further, an error of the sucking position 38A of the electronic component 38 due to the adjustment of the angular position of the electronic component 606 for compensation of the angular positioning error is obtained.

Where a plurality of component mounting units 738 are provided, a plurality of component-holding heads 690 are provided. In this case, a selected one of the plurality of heads 690 is used as a reference head whose rotation axis is used as a reference rotation axis, and the XY positioning errors of the rotation axis of the other heads 690 are detected with respect to the reference rotation axis. The component-holding head 690 may be modified to hold a plurality of suction nozzles 744. In this case, a selected one of the suction nozzles 744 is used as a reference suction nozzle.

Where the positioning errors of the sucking surface of the suction nozzle and other positioning errors are detected while the mounting system 601 is not in the component mounting operation, the positioning errors of the image-taking devices may be corrected by adjusting the center position of the electronic component, without adjusting the actual positions of the image-taking devices. In this case, the position adjustment of the image-taking devices is affected only when the positioning errors such as those of the sucking surface of the suction nozzle are detected during manufacture or maintenance inspection of the mounting system 601. That is, the positions of the image-taking devices are not adjusted even if the positioning errors of the image-taking devices are detected upon detection of the positioning errors of the sucking surface and other positioning errors prior to a component mounting operation. The detected positioning errors of the mage-taking devices are corrected by adjusting the center position of the electronic component. In this case, the horizontal positioning error of the electronic component with respect to the detected rotation axis of the reference suction nozzle is detected, and the positions of the rotation axes of the other suction nozzles are obtained on the basis of the position of the rotation axis of the reference suction nozzle and the positioning error of the image-taking device with respect to the rotation axis of the reference suction nozzle, so that the errors of the sucking position of the electronic component with respect to the rotation axes of the other suction nozzles are detected.

In the illustrated embodiments described above, the image of the sucking surface of the suction nozzle is taken by the component camera of image-taking device provided to take the image of the electronic component held by the suction nozzle. However, the image of the sucking surface may be taken by another image-taking device.

In the electronic component mounting system according to the first embodiment of FIGS. 1–14 using the two component cameras 350, 352, only one component camera may be provided. In this instance, the component camera may be arranged to adjust its ratio of magnification.

While the presently preferred embodiments of the present invention have been described in detail, for illustrative purpose only, it is to be understood that the present invention may be embodied with various changes and improvements, such as those described in the SUMMARY OF THE INVENTION, which may occur to those skilled in the art.

What is claimed is:

1. An electric-component mounting system for mounting electric components on a circuit substrate, comprising:

a component supply device having a component-supply portion from which said electronic components are supplied one after another;

a circuit-substrate support device that supports said circuit substrate;

a component-holding head rotatable about an axis of rotation thereof and arranged to removably hold a suction nozzle having a sucking surface such that said suction nozzle extends in an axial direction of said component-holding head, said suction nozzle holding each one of said electric components supplied from said component-supply portion of said component supply device, and mounting said each one electric component on said circuit substrate supported by said circuit-substrate support device;

a head rotating device operable to rotate said component-holding head;

a relative-movement device operable to move at least one of said component-holding head and said component supply device relative to an other of said component-holding head and said component supply device, in a direction intersecting said axis of rotation of said component-holding head;

an axial-movement device operable to move at least one of said component-holding head and said component supply device in said axial direction toward and away from an other of said component-holding head and said component supply device;

an image-taking device operable to take an image of said sucking surface in said axial direction toward said sucking surface; and a control device operable to control said head rotating device, said relative-movement device, said axial-movement device and said image-taking device, and wherein said control device includes a relative-position obtaining portion operable to obtain a relative position between said sucking surface and said axis of rotation of said component-holding head;

a relative-movement control portion operable to control said relative-movement device, for effecting a relative movement between said component-holding head and said component supply device on the basis of said relative position obtained by said relative-position obtaining portion, so as to minimize an error of relative positioning between said sucking surface and a predetermined sucking position of said each one electric component positioned at said component-supply portion of said component supply device; and a component-transfer control portion operable after said relative movement between said component-holding head and said component supply device by said relative-movement device, to control said axial-movement device to move said at least one of said component-holding head and said component supply device toward said other of said component-holding head and said component supply device, for transferring said each one electric component from said component-supply portion of said component supply device to said suction nozzle.

2. The electric-component mounting system according to claim 1, wherein said relative-position obtaining portion, said relative-movement control portion and said component-transfer control portions are all operable when said component-holding head is placed in a predetermined angular position.

3. The electric-component mounting system according to claim 1, wherein said relative-movement device comprises:

a head turning device operable to turn said component-holding head about a turning axis, such that said component-holding head can be sequentially stopped at a plurality of working positions which are arranged along a circular path of turning of said component-holding head; and a component-supply-device positioning device operable to move said component supply device in a direction of tangency to said circular path of turning, to bring said component-supply portion into alignment with one of said working positions.

4. The electronic-component mounting system according to claim 1, wherein said relative-movement control portion is operable to control said component-supply-device positioning device for positioning said component supply device such that said error of relative positioning between said sucking surface and said predetermined sucking position of said each one electric component in said direction of tangency is substantially zeroed.

* * * * *